United States Patent
Hamano et al.

[19]

[11] Patent Number: 5,844,611
[45] Date of Patent: Dec. 1, 1998

[54] IMAGE CODING SYSTEM WHICH LIMITS NUMBER OF VARIABLE LENGTH CODE WORDS

[75] Inventors: Takashi Hamano, Kawasaki; Kiyoshi Sakai, Yokohama; Kiichi Matsuda, Kawasaki, all of Japan

[73] Assignee: Fujitsu Limited, Kawasaki, Japan

[21] Appl. No.: 452,834

[22] Filed: May 30, 1995

Related U.S. Application Data

[63] Continuation of Ser. No. 273,613, Jul. 12, 1994, abandoned, which is a continuation of Ser. No. 674,338, Apr. 22, 1991, abandoned.

[30] Foreign Application Priority Data

Aug. 23, 1989 [JP] Japan .................................. 1-214822

[51] Int. Cl.⁶ .......................................................... H04N 7/30
[52] U.S. Cl. .......................................................... 348/403
[58] Field of Search ..................................... 358/136, 133; 348/400, 401, 402, 403, 404, 409, 415, 420, 421, 390, 384, 416; 341/63, 67, 87, 50; H04N 7/13, 7/133, 7/137

[56] References Cited

U.S. PATENT DOCUMENTS

| | | | |
|---|---|---|---|
| 4,751,742 | 6/1988 | Meeker | 348/408 |
| 4,792,851 | 12/1988 | Mochizuki | 358/136 |
| 4,816,914 | 3/1989 | Ericcson | 358/133 |
| 4,827,338 | 5/1989 | Gerard | 348/408 |
| 4,833,535 | 5/1989 | Ozeki et al. | 358/136 |
| 4,894,713 | 1/1990 | Delogne et al. | 358/133 |
| 4,901,075 | 2/1990 | Vogel | 341/63 |
| 4,908,862 | 3/1990 | Kaneko et al. | 348/409 |
| 4,922,273 | 5/1990 | Yonekawa et al. | 358/429 |
| 4,941,043 | 7/1990 | Jass | 358/133 |
| 4,942,467 | 7/1990 | Waldman et al. | 358/133 |
| 4,957,688 | 9/1990 | DeWith | 358/133 |
| 5,007,102 | 4/1991 | Haskell | 348/409 |
| 5,016,010 | 5/1991 | Sugiyama | 341/67 |
| 5,072,295 | 12/1991 | Murakami et al. | 358/136 |
| 5,073,820 | 12/1991 | Nakagawa et al. | 358/133 |
| 5,086,488 | 2/1992 | Kato et al. | 382/56 |
| 5,162,908 | 11/1992 | Kim | 348/403 |
| 5,309,231 | 5/1994 | Hamada et al. | 348/404 |
| 5,327,173 | 7/1994 | Nishizawa et al. | 348/409 |

FOREIGN PATENT DOCUMENTS

| | | | |
|---|---|---|---|
| 0380081 | 8/1990 | European Pat. Off. | H03M 7/30 |
| A-0 380 081 | 8/1990 | European Pat. Off. | |
| 63-246976 | 10/1988 | Japan | H04N 1/41 |
| A-63 246 976 | 10/1988 | Japan . | |
| 2-194734 | 8/1990 | Japan . | |

OTHER PUBLICATIONS

Plompen et al, "Motion Video Coding in CCITT S G X V—The Video Source Coding", IEEE, 1988 (month not available).

IEEE Global Telecommunications Conference & Exhibition: Conference Record, Nov. 1988, Hollywood, FLA., USA pp. 997–1004; Plompen et al: "Motion Video Coding in CCITT SG XV—The Video Source Coding".

*Primary Examiner*—Bryan Tung
*Attorney, Agent, or Firm*—Staas & Halsey

[57] ABSTRACT

An image encoding control system includes an orthogonal transform encoder for carrying out orthogonal transform coding for each block which includes transform coefficients related to a plurality of blocks, each block obtained by dividing one picture of an input image signal into the plurality of blocks, a code control for controlling the transform coefficients obtained for each block so that the number of variable-length code words obtained for each block is equal to or smaller than a predetermined number of variable-length code words, a variable-length encoder for converting the transform coefficients obtained for each block into variable-length code words, and a buffer memory for temporarily storing the variable-length code words output by the variable-length encoder for each block.

28 Claims, 22 Drawing Sheets

| 5→0 | 0→0 | 0→0 | 0→2 | 0→15 | | | |
|---|---|---|---|---|---|---|---|
| 0 | 0 | 0 | 0 | 5 | 0 | 0 | 0 |
| 0 | 0 | 0 | 0 | 0 | 0 | 0 | 0 |
| 0 | 7 | 0 | 0 | 0 | 0 | 0 | 0 |
| 0 | 0 | 0 | 0 | 7 | 0 | 0 | 0 |
| 2 | 0 | 0 | 0 | 0 | 0 | 0 | 0 |
| 0 | 0 | 0 | 0 | 0 | 0 | 0 | 0 |
| 0→0 | 0 | 0 | 0 | 0 | 0 | 0 | 0 |

(b)

```
( 0, 5)   00100 1101
(10, 7)   00000100101000000111
( 3, 2)   00100 1001
( 0, 5)   00100 1101
( 3, 2)   00100 1001
( 7, 15)  0000010001 1 10000 1111
(10, 7)   00000100101000000111
  EOB     10
```

| 5 | 0 | 0 | 0 | 0 | 2 | 0 | 15 |
|---|---|---|---|---|---|---|---|
| 0 | 0 | 0 | 0 | 5 | 0 | 0 | 0 |
| 0 | 0 | 0 | 0 | 0 | 0 | 0 | 0 |
| 0 | 7 | 0 | 0 | 0 | 0 | 0 | 0 |
| 0 | 0 | 0 | 0 | 0 | 0 | 0 | 0 |
| 2 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

(b)

```
LIMITED TO SIX
VARIABLE-LENGTH CODE
WORDS OR SMALLER EXCEPT
FOR EOB
( 0, 5)   00100 1101
(10, 7)   00000100101000000111
( 3, 2)   00100 1001
( 0, 5)   00100 1101
( 3, 2)   00100 1001
( 7, 15)  000001000 1 1 10000 1111
  EOB     10
```

FIG. 6A QUANTIZED OUTPUT { 5 0 0 0 0 0 0 0 0 0 7 0 0 0 2 5 0 0 0 0 0 0 0 0 2 0 0 0 0 0 0 0 0 0 0 0 1 5 0 0 0 0 0 0 0 0 0 0 7...
⇑ ⇑⇑ ⇑ ⇑ ⇑
UP UP UP UP UP
COUNT COUNT COUNT COUNT COUNT

SELECT 0
IN RESPONSE TO
SELECT SIGNAL
⇑

FIG. 6B CODE CONTROL OUTPUT 5 0 0 0 0 0 0 0 0 0 7 0 0 0 2 5 0 0 0 0 0 0 0 0 2 0 0 0 0 0 0 0 0 0 0 0 1 5 0 0 0 0 0 0 0 0 0 0 0...

FIG. 13A QUANTIZED OUTPUT { 5 0 0 0 0 0 0 0 0 0 7 0 0 0 2 5 0 0 0 0 0 0 0 0 2 0 0 0 0 0 0 0 0 0 0 0 1 5 0 0 0 0 0 0 0 0 0 0 7...
⇑⇑ ⇑⇑⇑ ⇑⇑ ⇑
UP UP UP UP
COUNT COUNT COUNT COUNT

SELECT 0
IN RESPONSE TO
SELECT SIGNAL

FIG. 13B CODE CONTROL OUTPUT 5 0 0 0 0 0 0 0 0 0 7 0 0 0 2 5 0 0 0 0 0 0 0 0 0 0 0 0 0 0 0 0 0 0 0 0 0 0 0 0 0 0 0 0 0 0 0 0 0...

FIG. 8A BLOCK SYNCHRONIZING SIGNAL

FIG. 8B ROM (WRITE INSTRUCTION)

FIG. 8C ROM (= 0)

FIG. 8D COUNTER OUTPUT

FIG. 8E CODE CONTROL OUTPUT

FIG. 8F DATA WRITTEN INTO MEMORY

FIG. 9A

ROM TABLE

| ADDRESS | | DATA | |
|---|---|---|---|
| BLOCK SYNCHRONIZING SIGNAL | CODE CONTROL OUTPUT | WRITE | =0 |
| 0 | * | 0 | 0 |
| 1 | 0 | 1 | 1 |
| 1 | OTHER THAN ABOVE | 0 | 0 |

FIG. 9B

EXAMPE OF ENCODING TABLE

| BLOCK SYNCHRONIZING SIGNAL | RUN | OUTPUT | CODE LENGTH | CODE WORD |
|---|---|---|---|---|
| 0 | | 0 | 2 | 10 |
| 0 | 0 | 1 | 5 | 110 10 |
| 0 | 0 | 2 | 7 | 01000 10 |
| 0 | 0 | 3 | 8 | 001010 10 |
| ⋮ | | | | |
| 1 | 0 | 1 | 3 | 110 |
| 1 | 0 | 2 | 5 | 01000 |
| 1 | 0 | 3 | 6 | 001010 |
| ⋮ | | | | |

FIG.12A PRIOR ART (a)

| 5 | 0 | 0 | 0 | 0 | 2 | 0 | 15 |
|---|---|---|---|---|---|---|---|
| 0 | 0 | 0 | 0 | 5 | 0 | 0 | 0 |
| 0 | 0 | 0 | 0 | 0 | 0 | 0 | 0 |
| 0 | 7 | 0 | 0 | 0 | 0 | 0 | 0 |
| 0 | 0 | 0 | 0 | 7 | 0 | 0 | 0 |
| 2 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

(b)

| 5 | 01101 |
|---|---|
| 0 × 10 | 01010011 |
| 7 | 0000001 |
| 0 × 3 | 010011 |
| 2 | 001 |
| 5 | 01101 |
| 0 × 3 | 010011 |
| 2 | 001 |
| 0 × 7 | 01010010 |
| 15 | 00000100001111 |
| 0 × 10 | 01010011 |
| 7 | 0000001 |
| EOB | 0001 |

FIG.12B (a)

| 5 | 0 | 0 | 0 | 0 | 2 | 0 | 0 |
|---|---|---|---|---|---|---|---|
| 0 | 0 | 0 | 0 | 5 | 0 | 0 | 0 |
| 0 | 0 | 0 | 0 | 0 | 0 | 0 | 0 |
| 0 | 7 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

(b)

LIMITED TO SIX VARIABLE-LENGTH CODE WORDS OR SMALLER EXCEPT FOR EOB

| 5 | 01101 |
|---|---|
| 0 × 10 | 01010011 |
| 7 | 0000001 |
| 0 × 3 | 010011 |
| 2 | 001 |
| 5 | 01101 |
| EOB | 0001 |

ROM TABLE

| ADDRESS | DATA | |
|---|---|---|
| NZR | QUANTIZED OUTPUT | DELAY DEVICE | COUNTER |
| 0 | 0 | 0 | 0 |
| 1 | 0 | 0 | 1 |
| * | OTHER THAN ABOVE | 1 | 1 |

FIG. 14

ROM TABLE

| ADDRESS | | | DATA | |
|---|---|---|---|---|
| BLOCK SYNCHRONIZING SIGNAL | CONTROL OUTPUT | OUTPUT OF DELAY DEVICE 144 | WRITE INSTRUCTION | SELECT | CLEAR |
| 0 | * | * | 0 | 1 | 0 |
| 1 | 0 | 0 | 0 | 0 | 1 |
| 1 | * | 0 | 0 | 1 | 0 |
| OTHER THAN ABOVE | | | 1 | 0 | 1 |

FIG. 16

FIG. 17A SYNC. SIGNAL (AFTER DELAY)

FIG. 17B WRITE INSTRUCTION (AFTER DELAY)

FIG. 17C SELECT SIGNAL

FIG. 17D CLEAR

FIG. 17E COUNTER OUTPUT       **0 0 1 2 3 4 5 6 7 8 9 10 0 1 2 3 0 0 1 2 3 4 5 6 7 8 9 10 11 12 13...

FIG. 17F OUTPUT OF DELAY 148  ****0 0 1 2 3 4 5 6 7 8 9 10 0 1 2 3 0 0 1 2 3 4 5 6 7 8 9 10 11 12 13...

FIG. 17G CODE CONTROL OUTPUT  ****5 0 0 0 0 0 0 0 0 0 7 0 0 0 2 5 0 0 0 0 0 0 0 0 0 0 0 0 0 0...

FIG. 17H OUTPUT OF DELAY 144  ******5 0 0 0 0 0 0 0 0 0 7 0 0 0 2 5 0 0 0 0 0 0 0 0 0 0 0 0 0 0...

FIG. 17I WRITE DATA   SYNC.  0 1   1 1     1 1 1
                      0 or 1  1 1   0 1     0 1 1
                      DATA   * 5   107     3 2 5

RUN LENGTH

| BLOCK SYNC. SIGNAL | SELECTED OUTPUT | CODE LENGTH | CODE WORD |
|---|---|---|---|
| 1 | 0 | 1 | 5 | 0111 |
| 1 | 0 | 2 | 6 | 010101 |
| 1 | 0 | 3 | 7 | 010011 |
| ⋮ | ⋮ | ⋮ | ⋮ |

FIG. 18A

EFFECTIVE COEFFICIENT

| BLOCK SYNC. SIGNAL | SELECTED OUTPUT | CODE LENGTH | CODE WORD |
|---|---|---|---|
| 0 | 1 | 0 | 4 | 0001 |
| 0 | 1 | 1 | 5 | 1 0001 |
| 0 | 1 | 2 | 7 | 001 0001 |
| 0 | 1 | 3 | 8 | 0111 0001 |
| ⋮ | ⋮ | ⋮ | ⋮ |
| 1 | 1 | 1 | 1 | 1 |
| 1 | 1 | 2 | 3 | 001 |
| 1 | 1 | 3 | 4 | 0111 |
| ⋮ | ⋮ | ⋮ | ⋮ |

FIG. 18B

FIG. 22A
(a) X BLOCK
(b) X+1 BLOCK
(c) X+2 BLOCK
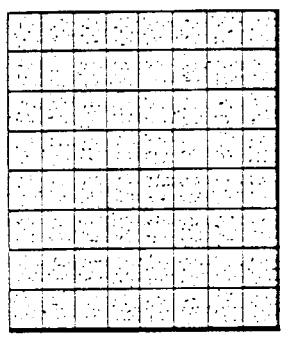
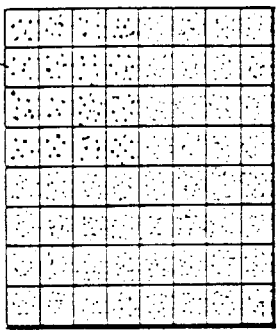
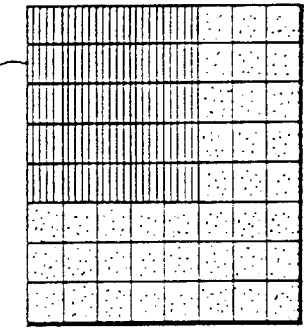
FIG. 22B
(a) X BLOCK
(b) X+1 BLOCK
(c) X+2 BLOCK
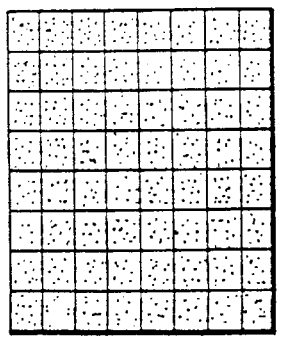
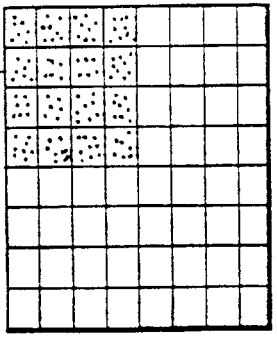
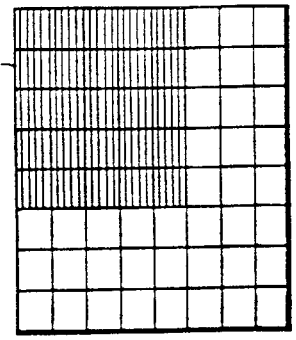

IMAGE CODING SYSTEM WHICH LIMITS NUMBER OF VARIABLE LENGTH CODE WORDS

This application is a continuation, of application Ser. No. 08/273,613, filed Jul. 12, 1994, now abandoned which is a continuation of application Ser. No. 07/674,338, filed Apr. 22, 1991, now abandoned.

TECHNICAL FIELD

The present invention relates to an image encoding control system which efficiently encodes an input image signal.

In order to reduce the bit rate of an image signal of a dynamic image or the like, a highly efficient encoding method is known which carries out an orthogonal transform encoding for each block obtained by dividing one picture plane into a plurality of blocks. There is a need to reduce the size of a circuit which implements such a highly efficient encoding method.

BACKGROUND ART

FIG. 1 is a block diagram showing an essential part of a conventional art. An image signal related to a dynamic image is applied to an orthogonal transform encoder 1. The orthogonal transform encoder 1 can be configured based on a Fourier transform, Hadamard transform, discrete cosine transform (DCT) or the like, and can also be configured based on a combination of a predictive encoding, such as an interframe encoding, and one of the above-mentioned transform procedures. Recently, the encoding structure based on the discrete cosine transform has been used in practical applications. A block subjected to the orthogonal transform encoding has a size which consists of 8 to 16 pixels in one dimension, and 8×8 to 16×16 pixels in two dimensions.

The image signal is subjected to the orthogonal transform encoding in the block by the orthogonal transform encoder 1. An encoded signal is input to a variable-length encoder 2, which converts the encoded signal into a variable-length code in which a short-length code is assigned to a signal having a high occurrence possibility. The variable-length codes are successively input to a buffer memory 3, which arranges them so that they have a data width equal to that of the buffer memory 3. Data read out from the buffer memory 3 is sent to a transmission line.

On the receiving side of the transmission line, the variable-length code is converted into a fixed length code by a variable-length decoder, and the original image signal is reproduced from the fixed length code by an orthogonal transform decoder which carries out a procedure reverse to the orthogonal transform encoding.

In the above-mentioned conventional image encoding system, the orthogonal transform encoding is carried out based on a processing block unit which compromises of, for example, n×m pixels (where n and m are arbitrary numbers). Then, all effective coefficients other than transform coefficients of zero are converted into a variable-length code output by the variable-length encoder 2. Thus, it is necessary for the variable-length encoder 2 to have an ability to perform variable-length encoding of a maximum of n×m signals and arrange variable-length codes so that they have a data width equal to the data width of the buffer memory 3. As a result, it is necessary to use a large size variable-length encoder.

Transform coefficients on the high-frequency component side obtained by the orthogonal transform encoding tend to become zero. From this point of view, it may be possible to process transform coefficients on the low-frequency component side in order to reduce the size of the variable-length encoder. However, in this case, the transform coefficients on the high-frequency component side are completely lost. Thus, the quality of the reproduced image may deteriorate greatly.

SUMMARY OF THE INVENTION

An object of the present invention is to provide an image encoding control system in which the above-mentioned problems are eliminated.

A more specific object of the present invention is to provide an image encoding control system which is capable of efficiently carrying out image encoding without causing deteriorating of the encoding characteristics and which can be implemented.

The above objects are achieved by an image encoding control system comprising: orthogonal transform encoding means for carrying out an orthogonal transform encoding for each block which includes transform coefficients related to a plurality of pixels, each block obtained by dividing one picture formed by an input image signal into a plurality of blocks; code control means for controlling the transform coefficients obtained for each block so that a number of variable-length code words obtained for each block is equal to or smaller than a predetermined number of variable-length code words; variable-length encoding means for converting the transform coefficients obtained for each block into variable-length code words; and buffer memory means for temporarily storing the variable-length code words output by the variable-length encoding means for each block.

The above-mentioned objects of the present invention are also achieved by an image encoding control system comprising: means for converting an analog image signal into a digital image signal; dividing means for dividing the digital image signals into X (X is an arbitrary integer) input image signals by a time division, each of the X input image signals having a frequency lower than that of the digital image signal; X orthogonal transform encoding means, respectively provided for the X input image signals, for carrying out an orthogonal transform encoding for each block obtained by dividing one picture plane of each of the input image signals into a plurality of blocks, each of the plurality of blocks having transform coefficients related to the pixels; X code control means, respectively provided for the X orthogonal transform encoding means, for controlling the transform coefficients output by the X orthogonal transform encoding means so that a number of variable-length code words obtained for each block is equal to or less than a predetermined number of variable-length code words; X coefficient processing means, respectively provided for the X code control means, for generating, for each block, data defining a variable-length code output from the transform coefficients output by the X code control means; select means for selecting the data generated by the X coefficient processing means on a time-division base to thereby output a data string; converting means for generating the variable-length code output from the data contained in the data strings; and buffer memory means for temporarily storing the variable-length code output output by the converting means.

BRIEF DESCRIPTION OF THE DRAWINGS

FIG. 5A is a diagram showing a conventional image encoding procedure which is carried out when the two-dimensional variable-length code is used;

FIG. 5B is a diagram showing an image encoding procedure which is carried out when an image encoding procedure according to the present invention is used;

FIGS. 6A and 6B are diagrams showing the operation of the code controller shown in FIG. 4 which is carried out when the two-dimensional variable-length code is used;

FIGS. 8A through 8F are diagrams showing the operation of a variable-length encoder shown in FIG. 7;

FIG. 9A is a diagram showing the relationship between the input and output of a ROM shown in FIG. 7;

FIG. 9B is a diagram showing the relationship between the input and output of an encoding table shown in FIG. 7;

FIG. 12A is a diagram showing a conventional image encoding procedure carried out when the run-length code is used;

FIG. 12B is a diagram showing an image encoding procedure according to the present invention which is carried out when the run-length code is used;

FIGS. 13A and 13B are diagrams showing the operation of a code controller shown in FIG. 11;

FIG. 14 is a diagram showing the relationship between the input and output of a ROM shown in FIG. 11;

FIG. 16 is a diagram showing the relationship between the input and output of a ROM shown in FIG. 15;

FIG. 17A through 17I are diagrams showing the operation of a variable-length encoder shown in FIG. 15;

FIG. 18A is a diagram showing the relationship between the input and output of an encoding table shown in FIG. 15 related to a string of zeros;

FIG. 18B is a diagram showing the relationship between the input and output of the encoding table shown in FIG. 15 related to effective coefficients;

FIG. 22A is a diagram showing a problem which may occur in any of the first, second and third embodiments;

FIG. 22B is a diagram showing how to solve the problem shown in FIG. 22A; and

BEST MODE OF CARRYING OUT THE INVENTION

The image coding control system according to the present invention controls the number of variable-length code words obtained from the block so that it is equal to or smaller than a predetermined number of variable length code words, and will now be described with reference to FIG. 2.

The image coding control system according to the present invention includes an orthogonal transform encoder 10, a variable-length encoder 12, a buffer memory 13 and a code controller 14. The orthogonal transform encoder 10 performs an orthogonal transform encoding for every block obtained by dividing one picture plane of an input image signal into blocks. The code controller 14 controls an output of the orthogonal transform encoder 10 so that the number of variable-length code words obtained from the block in the variable-length encoder 12 is equal to or smaller than a predetermined number of variable-length code words. The variable-length encoder 12 carries out a variable-length encoding of the output signal of the code controller 14 so that the length of the variable-length code, comprising a plurality of variable-length code words, becomes equal to the data width of the buffer memory 13. The buffer memory 13 temporarily stores the variable-length coding output generated by the variable-length encoder 12. The orthogonal transform encoding signal from the orthogonal transform encoder 10 is encoded by using a reproduced signal based on the output of the code controller 14.

Normally, a plurality of effective coefficients are obtained for each block processed by the orthogonal transform encoder 10. The code controller 14 controls the output of the orthogonal transform encoder 10, that is, transform coefficients, so that the number of variable-length code words generated for each block by the variable-length encoder 12 becomes equal to or smaller than a predetermined number of variable-length code words. The above arrangement makes it possible for the variable-length encoder 12 to have an ability to process the predetermined number of variable-length code words, so that the size of the circuit realizing the variable-length encoder 12 can be reduced, as compared with the size of the conventional variable-length encoder. In addition, even if the number of low-frequency components obtained by the orthogonal transform encoding is smaller than that of high-frequency components, it is possible to process such high-frequency components and thus suppress a deterioration in the quality of reproduced images.

Figure 2:
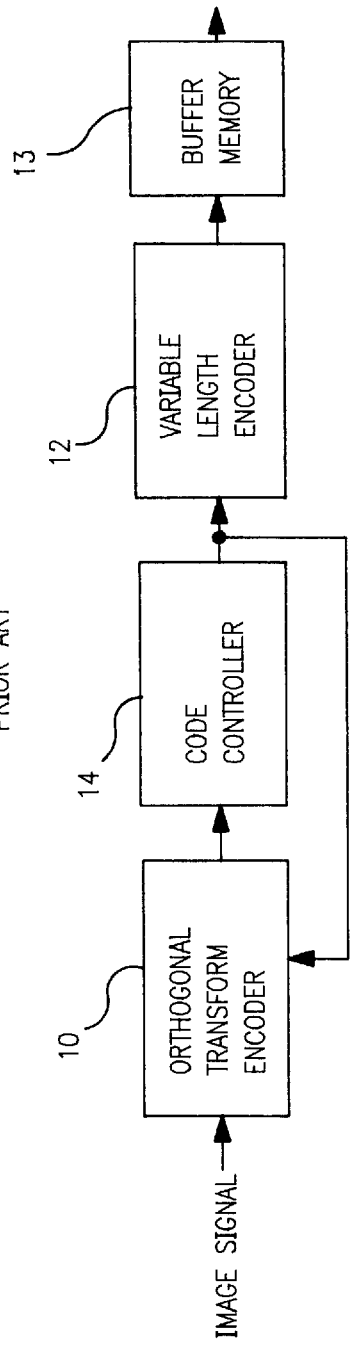
FIG. 2 is a block diagram showing a primary structure of an image encoding control system according to the present invention.
Figure 3:
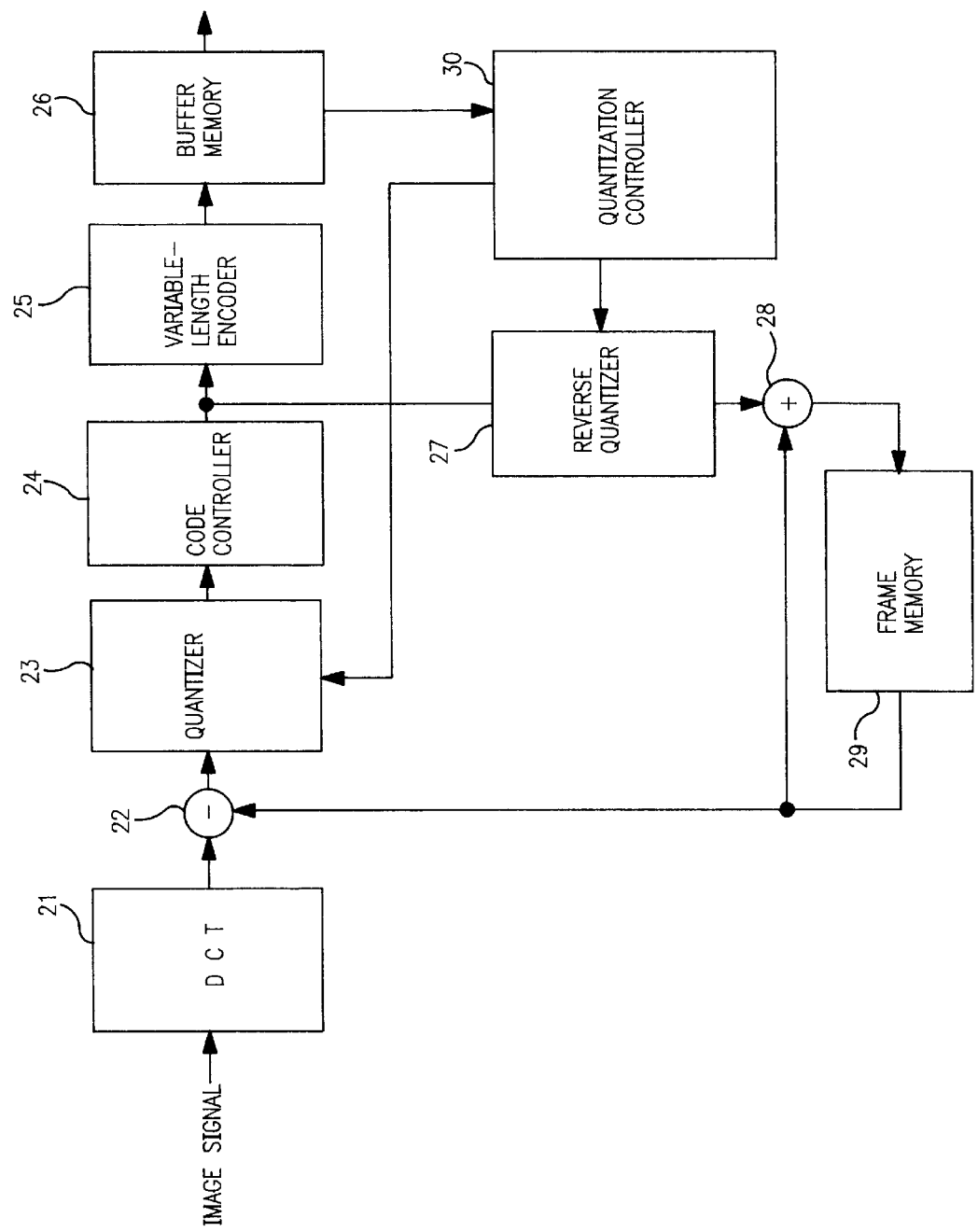
FIG. 3 is a block diagram of an embodiment of the image encoding control system shown in FIG. 2.

FIG. 3 is a block diagram showing the image encoding control system shown in FIG. 2 in more detail. The image encoding control system shown in FIG. 3 includes a discrete cosine transform (DCT) block 21, a subtracter 22, a quantizer 23, a code controller 24, a variable-length encoder 25, a buffer memory 26, a reverse quantizer 27, an adder 28, a frame memory 29 and a quantization controller 30. The orthogonal transform encoder 10 shown in FIG. 2 is made up of the discrete cosine transform unit 21, the subtracter 22 which carries out an interframe encoding, the quantizer 23, the reverse quantizer 27, the adder 28 and the frame memory 29.

The input image signal is subjected to the discrete cosine transform for every block by the discrete cosine transform unit 21. The output of the discrete cosine transform unit 21 is input to the subtracter 22, which generates the difference between the transform coefficients of the block being processed and the transform coefficients of the previous block. The quantizer 23 quantizes the above-mentioned difference, and a quantized output is input to the code controller 24. The code controller 24 controls the quantized output received from the quantizer 23 for every block so that the number of variable-length code words generated by the variable-length encoder 25 becomes equal to or smaller than a predetermined number of words. It will be noted that the variable-length code words are classified into two-dimensional variable-length codes and run-length codes. The code controller 24 has different structures dependent upon the types of variable-length code words. The structure of the code controller 24 will be described in detail later.

The variable-length code output from the variable-length encoder 25 is temporarily stored in the buffer memory 26, and read out and sent to a transmission line by a means which will be described later. The quantization controller 30 monitors the buffer memory 26 to determine how much of the buffer memory 26 has been filled with data, and controls quantizing steps of the quantizer 23 and the reverse quantizer 27 so that the buffer memory 26 is prevented from overflowing or underflowing. Control information about the quantizing steps is transmitted to the receiver side together with the variable-length code output.

A reverse-quantized difference signal related to the transform coefficients, which is output by the reverse quantizer 27, is added to the content of the previous frame (block) by the adder 28, and the result of the addition is input to the frame memory 29. The content of the frame memory 29 is read out when the next frame is processed.

Figure 4:
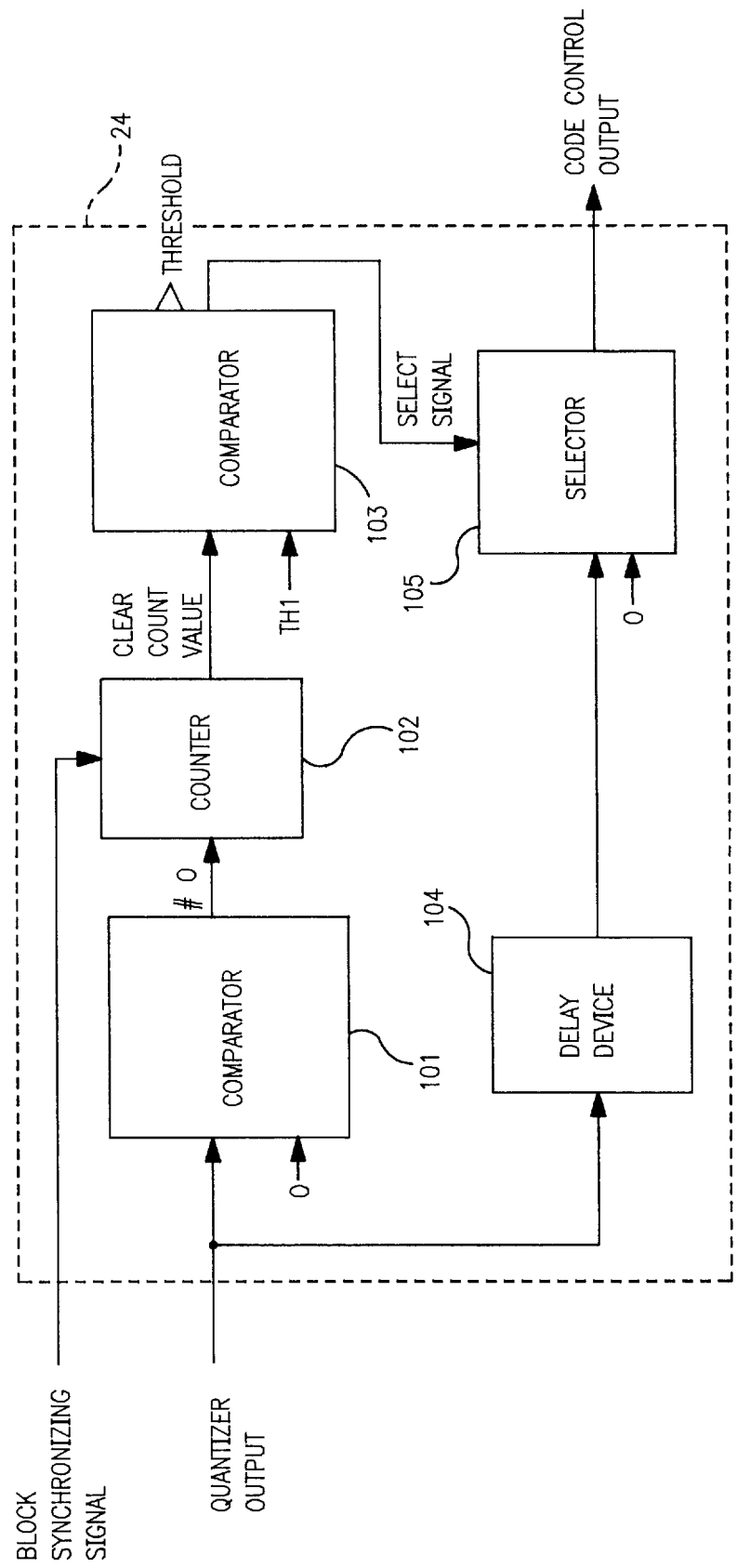
FIG. 4 is a block diagram showing the operation of a code controller shown in FIG. 3 used in a case where a two-dimensional variable-length code is used.

FIG. 4 is a block diagram showing the structure of the code controller 24 (first embodiment) using the two-dimensional variable-length codes. The code controller 24 includes a comparator 101, a counter 102, a comparator 103, a delay device 104 and a selector 105. The comparator 101 compares the quantized output (each transform coefficient) supplied from the quantizer 23 with zero, and outputs a signal (pulse signal) which indicates the up-count operation of the counter 102 when the quantized output is not zero. The counter 102 counts the pulse signals, each indicating the up-count operation, and is cleared by a block synchronizing signal which indicates the end of each block. That is, the counter 102 counts the pulse signals indicating the up-count operation for each block. The comparator 103 compares the count value in the counter 102 with a predetermined threshold value TH1, and outputs a select signal for making the selector 105 select zero when the count value in the counter 102 has become larger than the predetermined threshold value TH1. The delay device 104 delays the quantized output in order to synchronize the quantized output with the occurrence of the select signal. The selector 105 selects zero during the time the select signal from the comparator 103 is being input, and selects the quantized output (transform coefficients) from the delay device 104 in cases other than the case where the select signal is being input to the selector 105.

FIG. 5A(a) shows a quantized output related to a block output by the quantizer 23 in a case where one block (obtained by dividing one picture plane) consists of 8×8 pixels. By zigzag scanning the 8×8 block shown in FIG. 5A(a), a combination (zero-run length, effective coefficient) forming the two-dimensional variable-length code is obtained. The first two-dimensional variable-length code is (0, 5) where 5 is the effective coefficient at the left top pixel of the block (D.C. component) and 0 is the number of consecutive zeros (zero-run). The next effective coefficient obtained by the zigzag scan is 7, and the zero-run length is equal to 10, so that two-dimensional variable-length code (10, 7) can be obtained. In the same way, (3, 2), (0, 5), (3, 2), (7, 15) and (10, 7) are obtained. All the high-frequency components after effective coefficient "7" are zero, and thus no two-dimensional variable-length code is generated. Variable-length code words shown in FIG. 5A(b) related to the above-mentioned two-dimensional variable-length codes are obtained (EOB is an end-of-block signal indicating the end of the block and output in the state where the block synchronizing signal is active).

FIG. 5A relates to the conventional procedure. In the case shown in FIG. 5A, seven variable-length code words are obtained. If it is statistically confirmed that the quality of an image reproduced by six variable-length code words (six effective coefficients) except for the EOB has little deterioration, it is not necessary to transmit all seven variable-length code words. The code controller 24 subjects the quantized output to a process which will be described below, so that the number of variable-length code words obtained for every block is equal to or smaller than a predetermined number of words (which can statistically ensure little deterioration in the quality of the reproduced image).

FIG. 5B(a) shows the operation of the code controller 24 executed in the case where the number of variable-length code words is limited to six or smaller. The zigzag scan is carried out for the block shown in FIG. 5A(a). When the number of effective coefficients has become equal to six, each effective coefficient following the sixth effective coefficient is replaced by zero, so that variable-length code words shown in FIG. 5B(b) are obtained by the zigzag scan shown in FIG. 5B(a).

A description will now be given of the operation of the code controller 24 shown in FIG. 4 with reference to FIGS. 6A and 6B. The quantized output shown in FIG. 6A is input to the comparator 101. Data which is input to the comparator 101 for the first time is has an effective coefficient "5". In this case, the comparator 101 outputs the pulse signal which indicates the up-count operation. The counter 102 increments the count value by 1, so that the count value becomes 1 (before this operation, the counter 102 has been cleared by the EOB signal). Count value "1" is compared with the threshold value TH1 (for example, TH1=6) by the comparator 103. In this case, since the count value in the counter 102 is equal to 1, the comparator 103 does not output the select signal. Thus, the quantized output (effective coefficient "5") passes through the delay device 104 and the selector 105, and is input, as a code control output, to the variable-length encoder 25 (FIG. 3) (FIG. 6B).

Next, "0" is input to the comparator 101. In this case, the comparator 101 does not generate the pulse signal. Thus, the count value in the counter 102 does not change and is equal to 1.

After that, some zeros are successively input, and then effective coefficient "7" is input to the comparator 101. In this case, the counter 102 increments the count value by 1, so that it becomes equal to 2. In the same way, each time the effective coefficient is input, the count value in the counter 102 is incremented by 1. The comparator 103 outputs the select signal to the selector 105 when the count value in the counter 102 has become greater than six (TH1=6). In response to the select signal, the selector 105 selects "0" and outputs it. The selector 105 successively outputs "0" until the counter 102 is cleared by the block synchronizing signal (EOB signal) (FIG. 6B).

Figure 7:
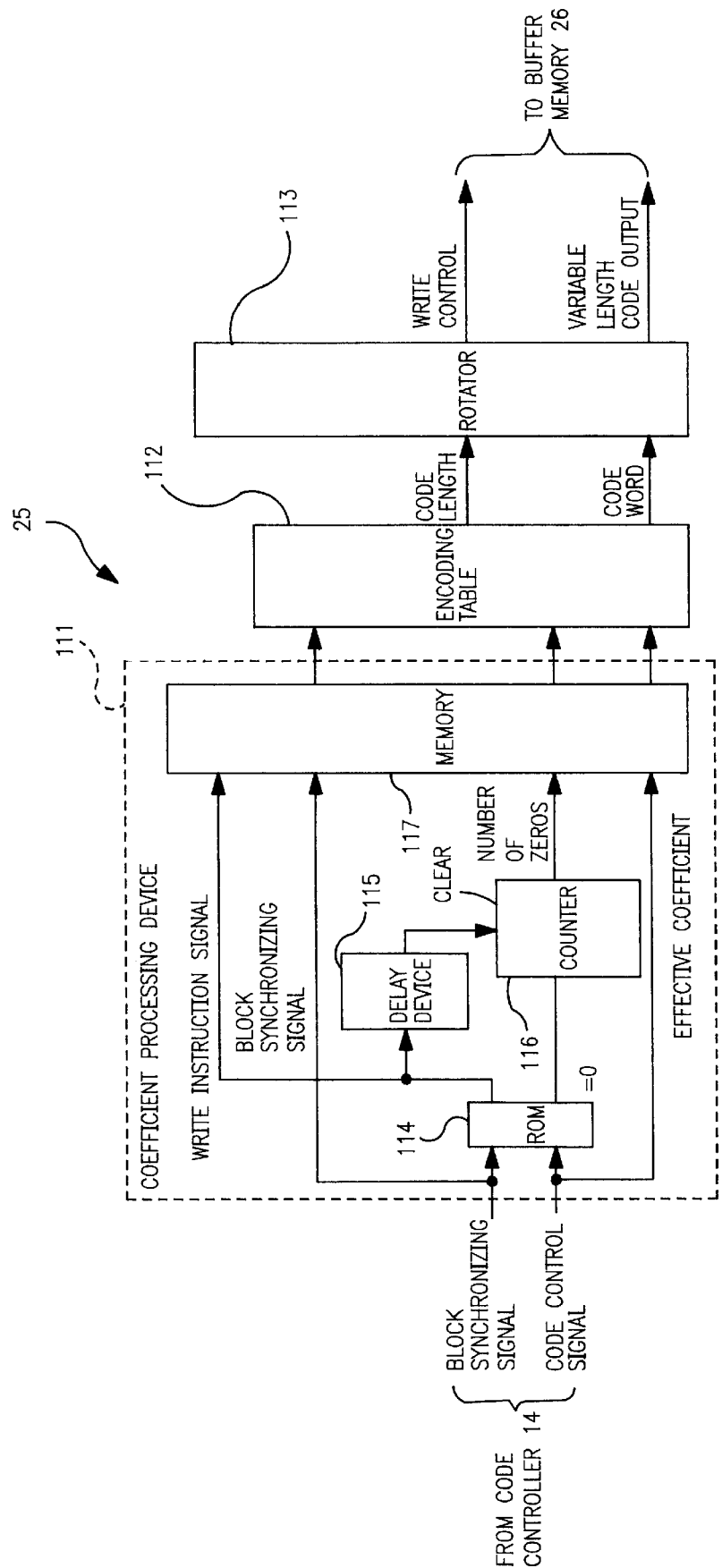
FIG. 7 is a block diagram showing the structure of the variable-length encoder shown in FIG. 3 used when the two-dimensional variable-length code is used.

FIG. 7 is a block diagram showing the structure of the variable-length encoder 25 shown in FIG. 3 used when the two-dimensional variable codes are used. The variable-length encoder 25 includes a coefficient processing device 111, an encoding table 112 and a rotator 113. The coefficient processing device 111 includes a ROM 114, a delay device 115, a counter 116 and a memory 117. The ROM 114 outputs a write instruction signal which instructs the memory 117 to write data when the code control output from the code controller 24 is other than zero. When the code control output is zero, the ROM 114 instructs the counter 116 to increment its count value by 1. The delay device 115 delays the write instruction signal output from the ROM 114 in order to synchronize the operation.

FIG. 9A is a diagram showing the operation of the ROM 114. The block synchronizing signal and the code control signal are input to the ROM 114 as an address thereof, and outputs the write instruction signal and data to the counter 116. Symbol "*" means "don't care". The write instruction signal is a low active signal.

Turning now to FIG. 7, the memory 117 functions as a buffer, and receives as inputs the block synchronizing signal, the write instruction signal the count value (number of zeros) from the counter 116 and the effective coefficient when the write instruction signal is applied (it is low (0)). The encoding table 112 receive as inputs the block synchronizing signal, the count value and the effective coefficient from the memory 117, and outputs a code length and a code word.

FIG. 9B is a diagram between the input and output of the encoding table 112. The last two bits of the code word, namely "10", obtained when the block synchronizing signal is zero (low level), form the EOB signal (the block signal maintained at the low level).

Turning now to FIG. 7, the rotator 113 generates a variable-length code output from the code word while referring to the code length obtained from the encoding table 112 in order to arrange the code words output from the encoding table 112 so that they have a data width of the buffer memory 26 (FIG. 3).

FIGS 8A through 8C are waveform diagrams showing the operation of the variable-length encoder 25 which is carried out when the code control output shown in FIG. 6B is input. The block synchronizing signal shown in FIG. 8A becomes zero (EOB) at the end of one block. At this time, data shown in FIG. 8F is written into the memory 117. As has been indicated, "*" means "don't care". First, code control output "5" is input to the ROM 114. At this time, the block synchronizing signal is equal to 1. Thus, as will be seen from FIG. 9A, the low-active write instruction signal becomes "0", and the counter 116 is supplied with "0". Thus, as shown in FIG. 8F, the block synchronizing signal "1", count value "0" and effective coefficient "5" are written into the memory 117.

After that, 10 zeros are successively input. The counter 116 increments its count value by 1 each time "0" is input starting from "0" subsequent to effective coefficient "5". When effective coefficient "7" is input to the ROM 114, it outputs the write instruction signal. The count value in the counter 116 obtained at this time is "10", which is written into the memory 117 together with block synchronizing signal "1" and effective coefficient "7". The above-mentioned write instruction signal is delayed by the delay device 115, and input, to the counter 116. Thereby, the counter 116 is cleared.

In the same way, subsequent data are written into the memory 117, as shown in FIG. 8F. The encoding table 112 refers to the table shown in FIG. 9B, and outputs the code length and code word to the rotator 113.

Figure 10:
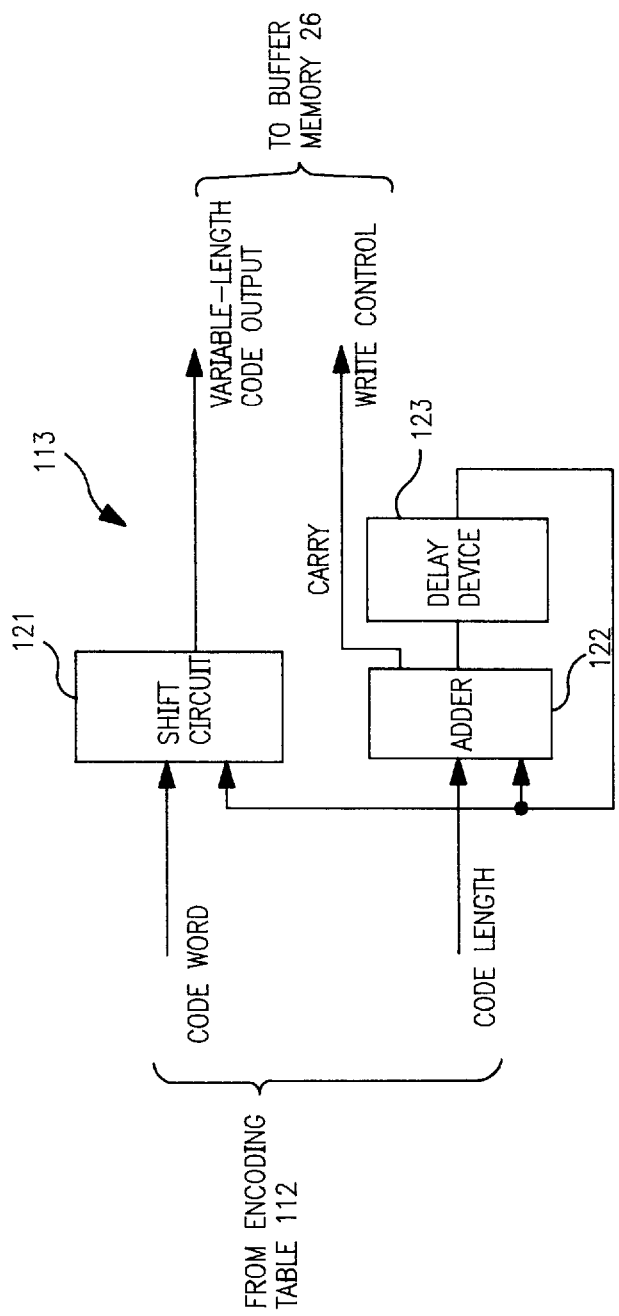
FIG. 10 is a block diagram of a rotator shown in FIG. 7.

FIG. 10 is a block diagram showing the structure of the rotator 113. The rotator 113 includes a shift circuit 121, an adder 122 and a delay device 123. The code length supplied from the encoding table 112 shown in FIG. 7 is input to the adder 122. The output of the adder 122 is delayed by a unit time by the delay device 123, and added to the code length input thereto. When the result of the adding operation exceeds the predetermined data width of the buffer memory 26 (FIG. 3), the adder 122 generates a carry. This carry is input to the buffer memory 26 as a write control signal. The code word from the encoding table 112 is shifted by the shift circuit 121 on the basis of the output signal of the delay device 123. The shifted code word is output to the buffer memory 26 as a variable-length code output.

A description will now be given of the structures of the code controller 24 and variable-length encoder 25 (second embodiment) used when the run-length codes are used. First, the structure of the encode controller 24 will be explained.

Figure 11:
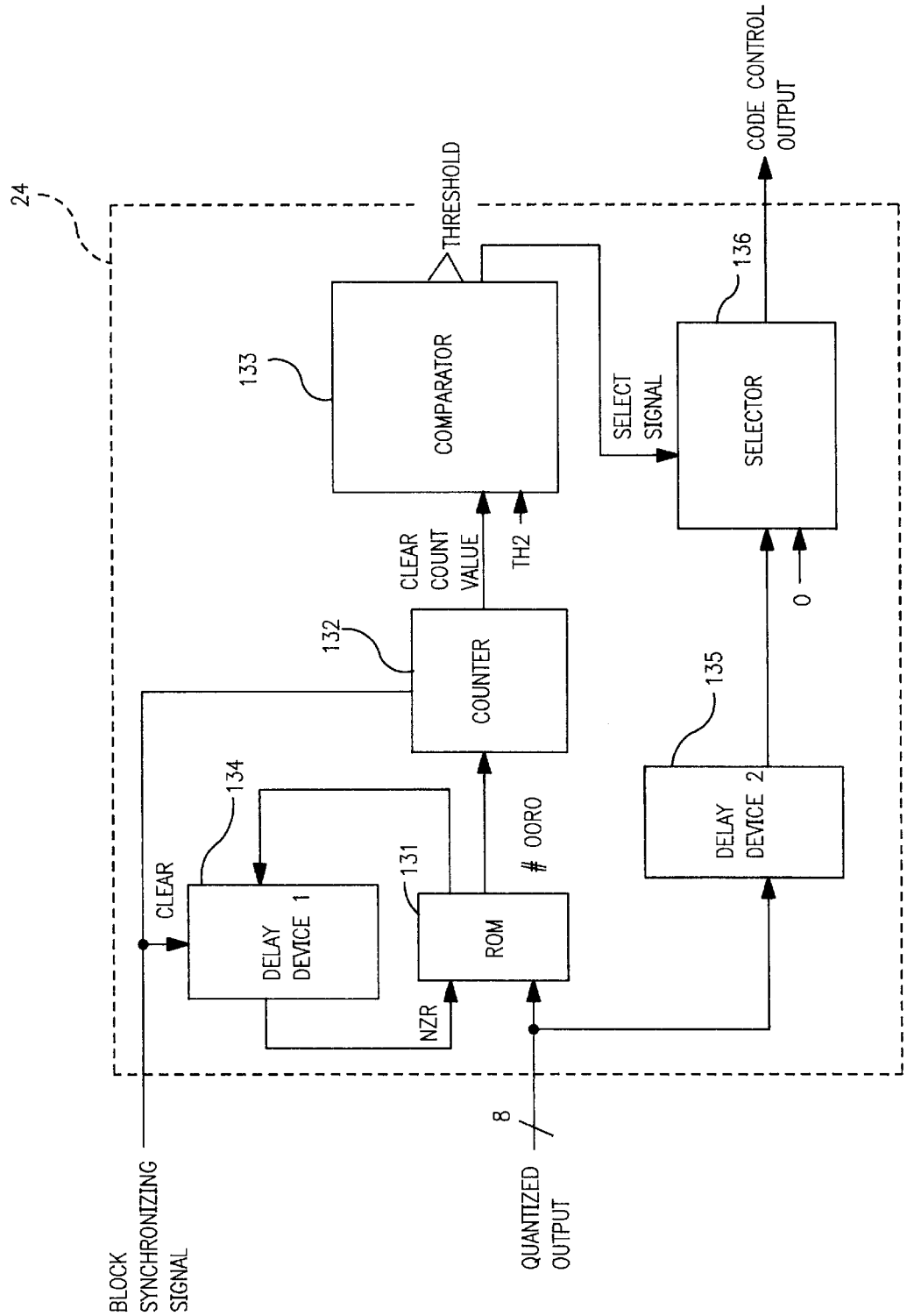
FIG. 11 is a diagram showing the structure of the encoding controller shown in FIG. 3 used when a run-length code is used.

FIG. 11 is a block diagram showing the structure of the code controller 24 used when the run-length codes are used. The code controller 24 includes a ROM 131, a counter 132, a comparator 133, a delay device 134, a delay device 135 and a selector 136. The ROM 131 receives a signal NZR which indicates whether or not the quantized output from the quantizer (FIG. 3) and the quantized output which precedes the former quantized output by one coefficient are zero. When the quantized output is other than "0" or the beginning of a zero-run, the ROM 131 outputs a pulse signal which indicates the up-count operation to the counter 132.

FIG. 14 is a diagram showing the relationship between the input and output of the ROM 131. The signal NZR and the quantized output are input to the ROM 131 as an address, and ROM 131 sends respective outputs data to the counters 132 and 134.

Turning now to FIG. 11, each time the up-count operation is instructed, the counter 132 increments its count value by 1. The counter 132 is cleared by the block synchronizing signal. The comparator 133 compares the count value in the counter 132 with a predetermined threshold value TH2, and outputs a select signal to the selector 136 when the count value has become greater than the threshold value TH2. The threshold value TH2 is selected so that the number of variable-length code words obtained in the block unit becomes equal to or smaller than a predetermined number of words. The delay device 134 is provided for synchronizing the entire operation. The delay device 134 is cleared by the block synchronizing signal, and outputs 1 (which means that the quantized output preceding by one coefficient is other than "0"). The delay device 135 is provided for synchronizing the quantized output with the select signal. The selector 136 selects "0" when the select signal is output, and selects the quantized output from the delay device 135 in other cases. The output of the selector 135 is input to the variable-length encoder 25 as the code control output.

By zigzag scanning one block shown in FIG. 12A(a), the effective coefficients and the numbers of consecutive zeros are obtained. In FIG. 12A(b), 0×10 means that there are 10 consecutive zeros. According to the conventional method, all the effective coefficients and the number of zeros contained in each zero-run in one block are calculated, and the variable-length code words shown in FIG. 12A(b) are obtained. On the other hand, according to the embodiment being considered, the number of quantized outputs becomes equal to or smaller than the predetermined number of quantized outputs due to the function of the encode controller 24.

FIG. 12B(a) shows the process carried out when the number of variable-length code outputs is limited to six or smaller. In this case, TH2=6. When the total number of effective coefficients and zero-runs becomes equal to six, each of the subsequent effective coefficients is set to zero. In the example shown in FIG. 12B, each effective coefficient after effective coefficient "5" is omitted.

FIG. 13 is a diagram showing the operation of the encode controller 24 shown in FIG. 11. When the ROM 131 inputs effective coefficient "5", it outputs the pulse signal indicating the up-count operation to the counter 132. Next, "0" is input to the ROM 131. This "0" is positioned at the beginning of a zero-run, and thus the ROM 131 outputs the pulse signal to the counter 132. In the above-mentioned way, each time the effective coefficient or "0" positioned at the beginning of the zero-run is input, the count value in the counter 132 is incremented by 1. When the count value in the counter 132 has become larger than the threshold value TH2, the comparator 133 outputs the select signal to the selector 136. In response to this select signal, the selector 136 successively outputs "0" until the block synchronizing signal is output.

Figure 15:
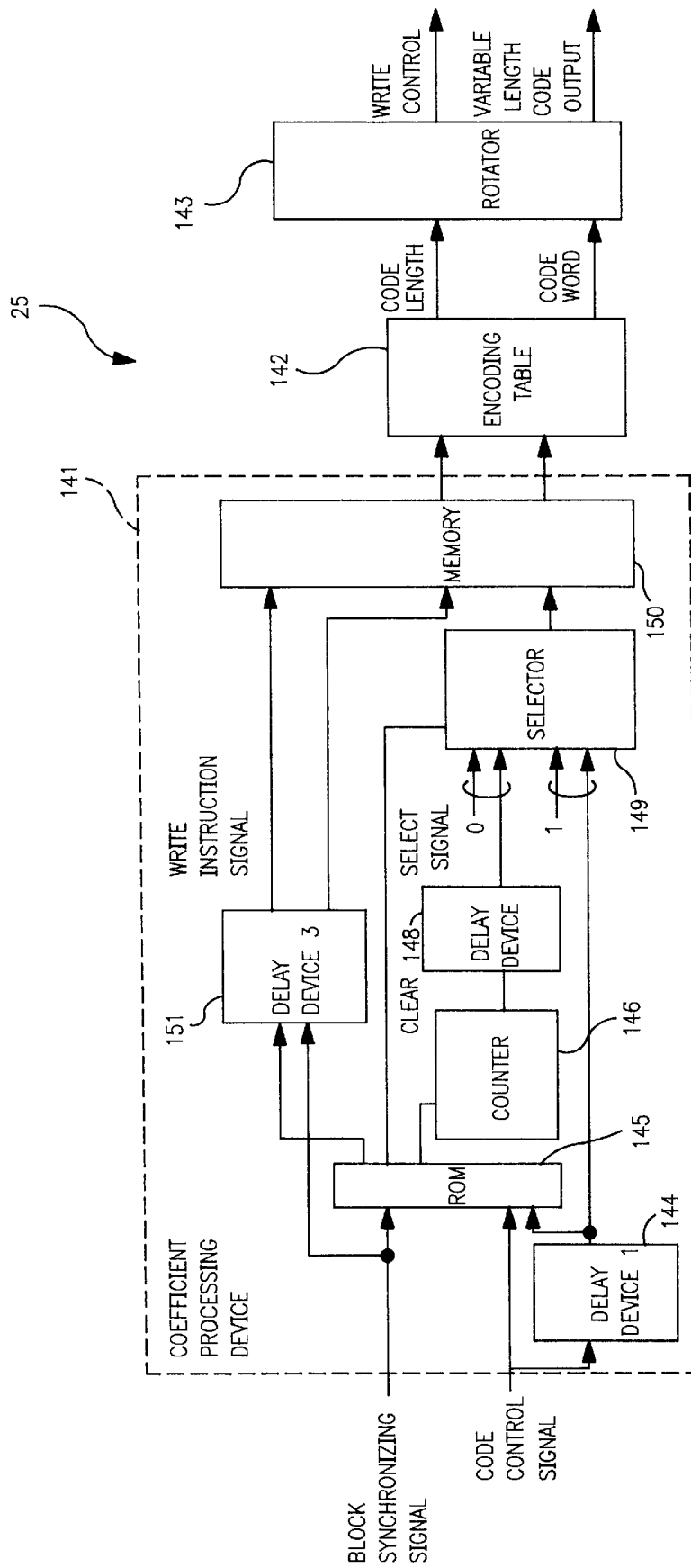
FIG. 15 is a diagram showing the structure of the variable-length encoder used when the run-length code is used.

FIG. 15 is a block diagram showing the structure of the variable-length encoder 25 used in the case where the run-length codes are used. The variable-length encoder 25 includes a coefficient processing device 141, an encoding table 142 and a rotator 143. The coefficient processing device 141 includes a delay device 144, a ROM 145, a counter 146, a delay device 148, a delay device 149, a memory 150 and a delay device 151.

The ROM 145 receives the block synchronizing signal, the code control output and the code control output preceding the former control output by one coefficient supplied from the delay device 144, and operates as follows. When the block synchronizing signal is low (EOB signal) or the code control output is other than "0", the counter 146 is cleared. When the output of the delay device 144 is other than "0", the output of the delay device 144 is "0" and the code control output is other than "0", or when the block synchronizing signal is low, the output of the ROM 145 instructs the writing of data into the memory 150 and outputs the select signal to the selector 149. FIG. 16 is a diagram showing the above-mentioned operation of the ROM 145.

After the counter 146 is supplied with the clear signal, the counter counts up its count value until the next clear signal is supplied thereto. The outputs of the delay devices 144 and 148 are input to the selector 149. The count value in the counter 146 indicates the number of zeros in the zero-run. In order to discriminate the number of zeros in the zero-run from any effective coefficient, the output of the delay device 148 is supplied to the selector 149 together with "0", and the output of the delay device 144 is supplied to the selector 149 together with "1". The selector selects the output of the delay device 148 (the number of zeros) together with "0" when there is no select signal (low level, "0"). On the other hand, when the select signal is output (high level, "1"), the selector 149 selects the output of the delay device 144 (effective coefficient) together with "1". The delay device 151 delays the block synchronizing signal and the write instruction signal in order to synchronize the entire operation. The memory 150 functions as a buffer, and receives the block synchronizing signal from the delay device 151 and the output from the selector 149 in synchronism with the write instruction signal from the delay device 151.

The encoding table 142 has an encoding table as shown in FIG. 18A and FIG. 18B. FIG. 18A relates to the case wherein run-length codes are used. The encoding table 142 shown in FIG. 18A inputs the block synchronizing signal and the output of the selector 149 as its address, and outputs a corresponding code length and code word. In this case, the output of the selector 149 is the output of the delay device 148 selected together with data "0" for use in the aforementioned discrimination. FIG. 18B relates to the case where effective coefficients are used. The encoding table 142 shown in FIG. 18B inputs the block synchronizing signal and the output of the selector 149 as its address, and outputs the code length and code word. In this case, the output of the selector 149 is the output of the delay device 144 selected together with data "1" for use in the above-mentioned discrimination. The rotator 143 has the same structure as the aforementioned rotator 113 (FIG. 10), and generates the variable-length code output by shifting the code length on the basis of the code word, and generates a write control signal from the code length.

FIGS. 17A through 17I are timing charts showing the operation of the variable-length encoder 25 shown in FIG. 15. FIG. 17A and FIG. 17B show the block synchronizing signal obtained on the output side of the delay device 151 and the write instruction signal respectively. When code control output "5" is input to the ROM 145, the last coefficient (indicated by *) is written into the memory 150 together with data "1" for use in the data discrimination. Code control output "5" is delayed by a unit time by the delay device 144, and supplied to the selector 149 together with data "1" for use in the data discrimination. At this time, "0" subsequent to effective coefficient "5" is input to the ROM 145, and the count value in the counter 146 becomes "1". At this time, the low-active write instruction signal is supplied to the memory 150 from the delay device 151, and thus, the memory 150 inputs the output of the selector 149. At this time, the select signal is high, and thus, code control output "5" from the delay device 144 is written into the memory 150 together with discrimination data "1".

Then, consecutive zeros are input to the ROM 145. Each time "0" is input, the count value in the counter 146 is incremented by +1. After ten consecutive zeros are input, code control output "7" is input to the ROM 145. At this time, the write instruction signal from the delay device 151 becomes active (low). The output of the delay device 148 obtained at this time is equal to 10, and the select signal is low. Thus, the output of the delay device 148, "10", selected together with discrimination data "0", is written into the memory 150. This "10" shows the number of consecutive zeros between effective coefficients "5" and "7". At the next timing, the write instruction signal is active, and the select signal changes from the low level to the high level. Thus, the output of the delay device 144, namely "7", is written into the memory 150 together with "1".

As has been explained above, by providing the code controller 24, it is enough for the variable-length encoder 25 to have an ability to generate the predetermined number of variable-length code words. This advantage of the present invention will now be described with reference to FIGS. 19A and 19B.

Figure 1:
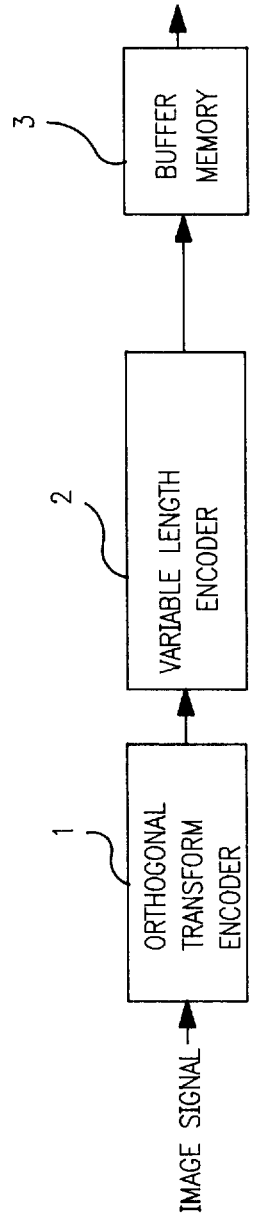
FIG. 1 is a block diagram of a conventional image encoding control system.
Figure 19A:
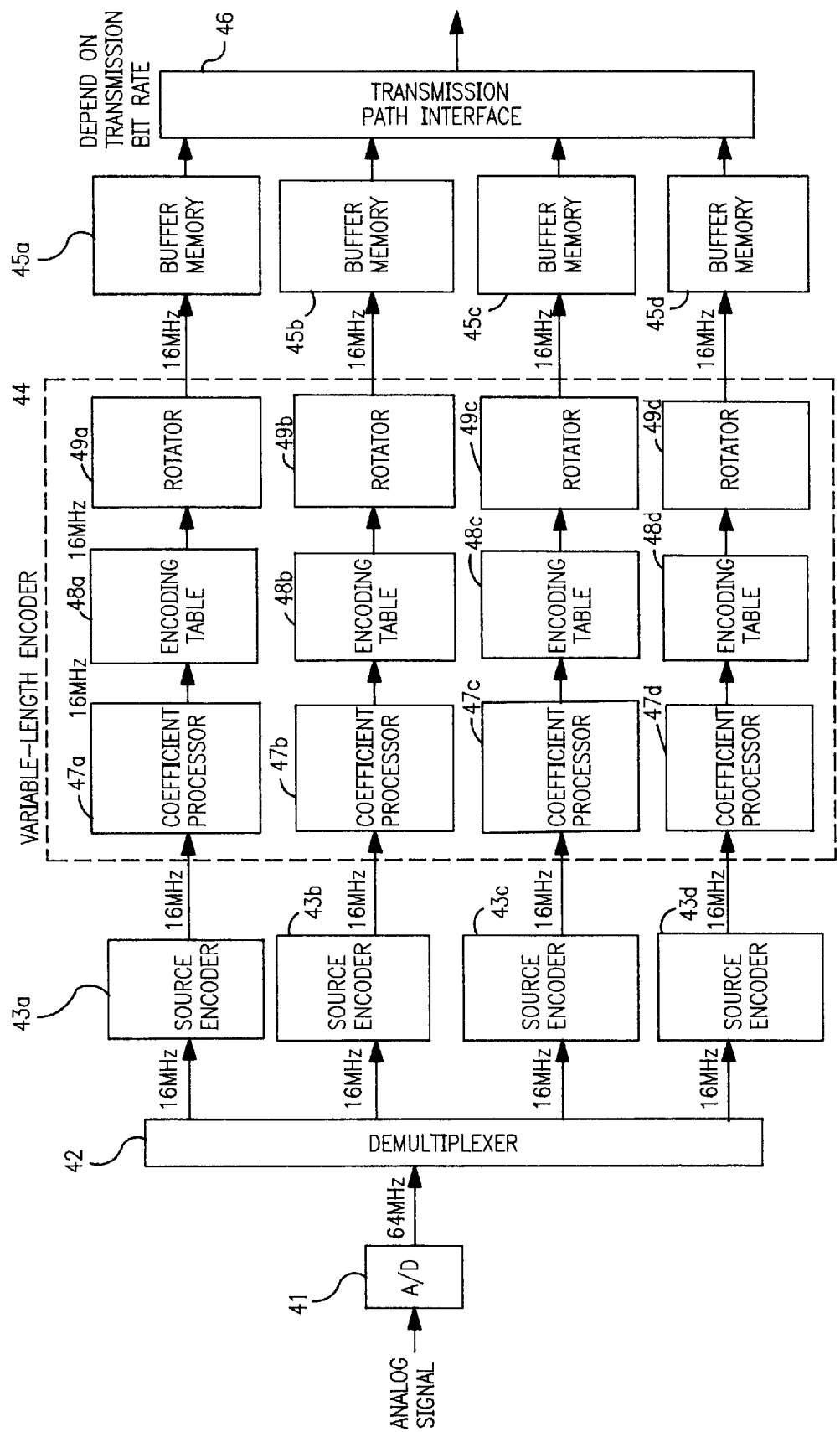
FIG. 19A is a block diagram of a conventional image encoding control system having a parallel structure.

FIG. 19A is a block diagram of a conventional image encoder which transfers image data in an HDTV (High Definition Television). The following description relates to a case where an analog image signal is digitized at a frequency of 64 MHz. It is difficult to directly encode the 64 MHz digital signal and generate variable-length encoding outputs in light of the processing speed. Thus, as shown in FIG. 19A, the analog image signal is converted into a 64 MHz digital signal by an A/D (analog-to-digital) converter 41, and the 64 MHz digital signal is divided into four 16 MHz digital signals by a demultiplexer 42. The four 16 MHz digital signals are processed in parallel form. For this purpose, the image encoder shown in FIG. 19A includes four source encoders 43a–43d, a variable-length encoder 44 having four systems, and four buffer memories 45a–45d. Each of the buffer memories 45a–45d is changed to a bit rate of a transmission path through a transmission path interface 46. Each of the source encoders 43a–43d corresponds to the orthogonal transform encoder 1 shown in FIG. 1. The variable-length encoder 44 includes four coefficient processing devices 47a–47d, four encoding tables 48a–48d, and four rotators 49a–49d. As shown, in the conventional image encoding system, it is necessary to design the source encoders 43a–43d and the variable-length encoders 44 so that they can process a 16 MHz digital signal. This requires a large amount of hardware.

Figure 19B:
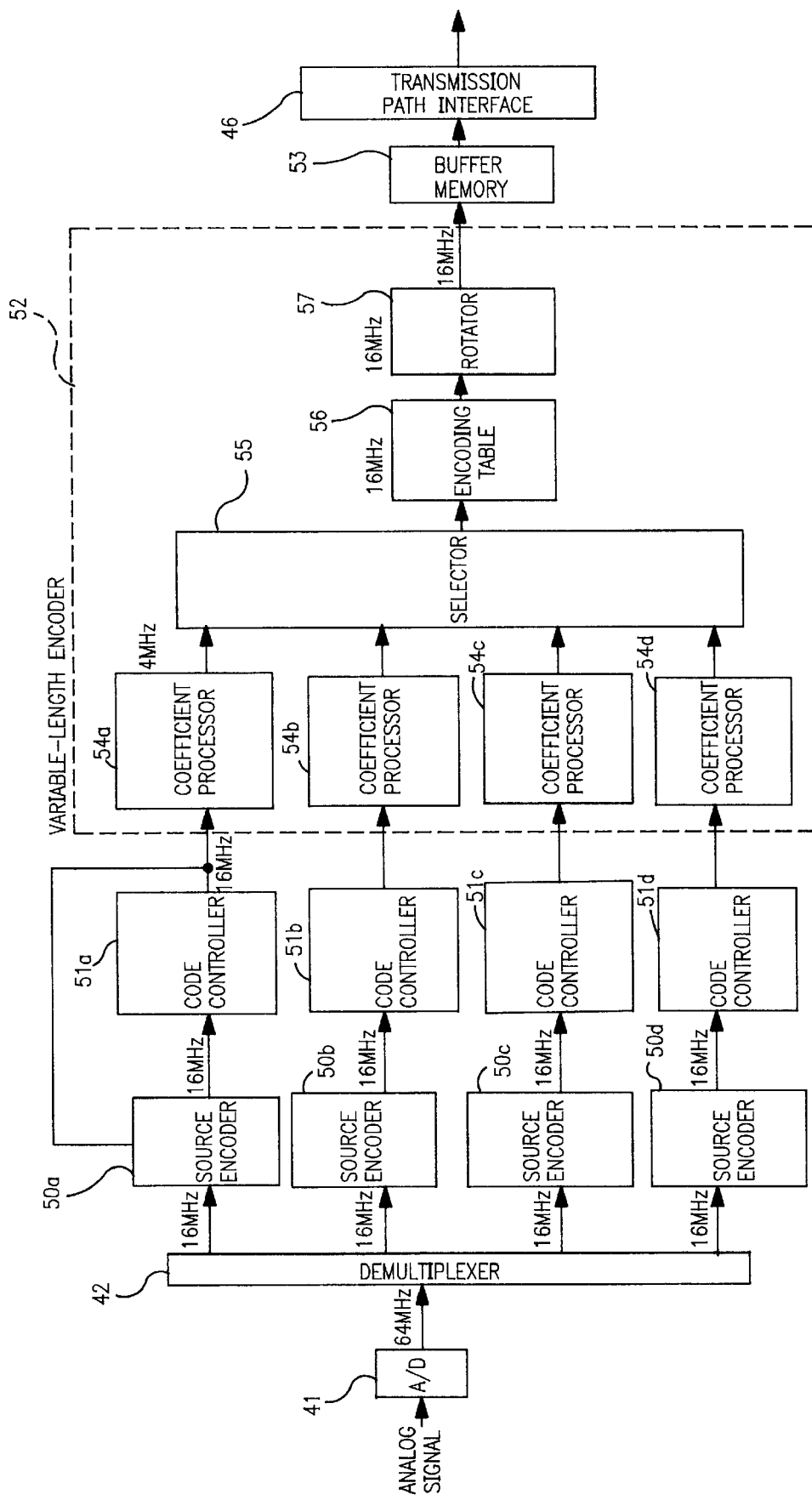
FIG. 19B is a block diagram of an image encoding control system having a parallel structure according to a second embodiment of the present invention.

On the other hand, the system can be configured as shown in FIG. 19B when a maximum of 16 variable-length code words are used for the 8×8 block. The image encode control system shown in FIG. 19B includes four source encoders 50a–50d, four code controllers 51a–51d, and a variable-length encoder 52. Each of the source encoders 50a–50d corresponds to the orthogonal transform encoder 10 shown in FIG. 2, and the variable-length encoder 52 comprises coefficient processing devices 54a–54d, a single selector 55, a single encoding table 56 and a single rotator 57. Since it is enough to process 16 variable-length code words with respect to the 8×8 block, the output of each of the coefficient processing devices 54a–54d is a digital signal having a frequency of 4 MHz (=16 MHz/(64/16)). The selector 55 successively selects one of the coefficient processing devices 54a–54d, and sends the output of the selected coefficient processing device to the encoding table 56. With this arrangement, it becomes possible to form the variable-length encoder 52 comprising the single selector 55, encoding table 56 and the rotator 57 and reduce the amount of hardware.

Further, the present invention has an advantage in that it becomes possible to use a circuit in common for the transmission side and the reception side by time division. This will now be described with reference to FIGS. 20A and 20B.

Figure 20A:
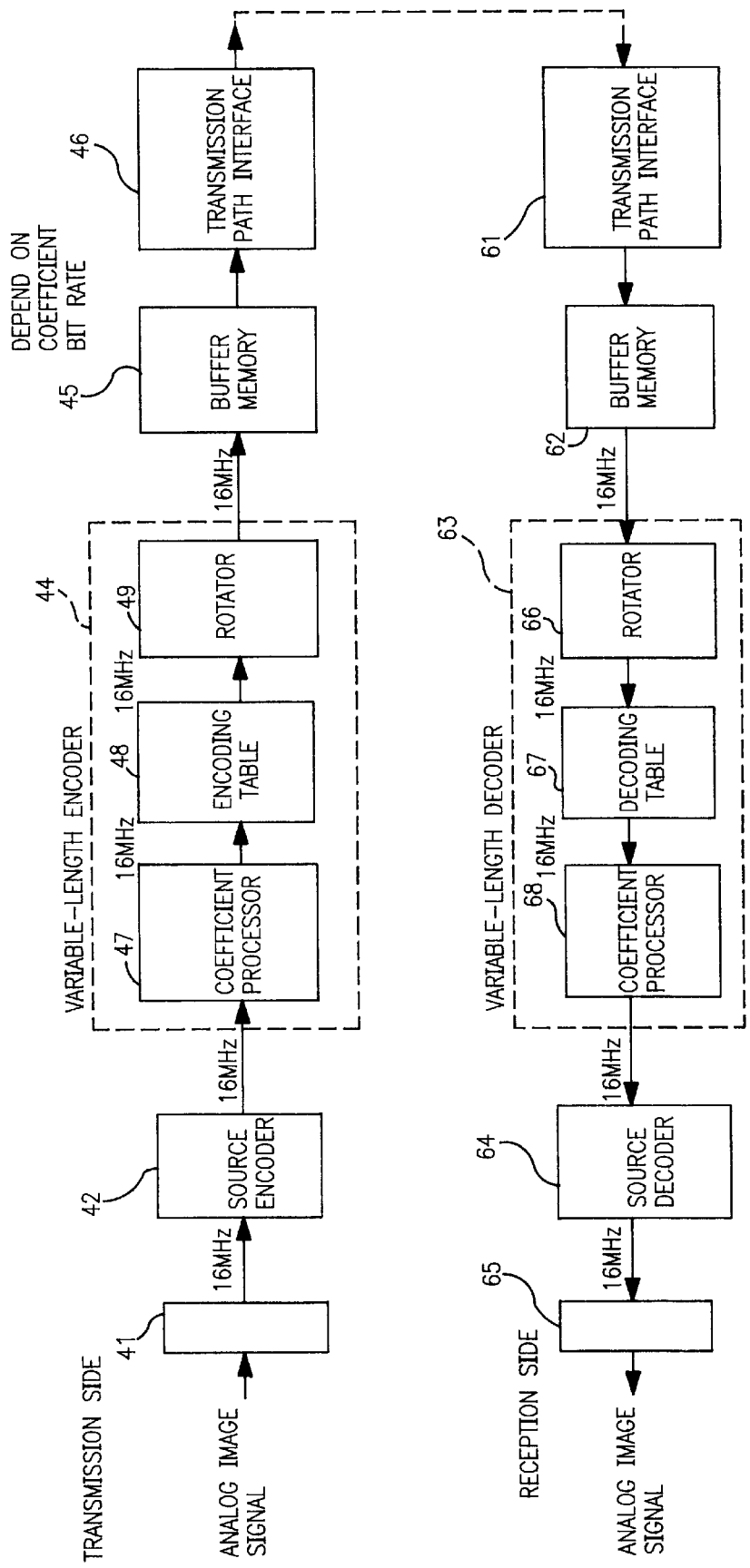
FIG. 20A is a block diagram of a transmission system having the conventional image encoding control system having the parallel structure shown in FIG. 18A.

FIG. 20A is a block diagram of a conventional transmission/reception system. Although four systems are provided on the transmission side, as shown in FIG. 19A, only one system is illustrated for the sake of simplicity, and each block on the transmission side is indicated by a reference numeral having no suffix shown in FIG. 19A. Similarly, although four systems are provided on the reception side, only one system is illustrated. The reception-side system has a single transmission interface 61, four buffer memories 62 (only one of them is illustrated), a variable-length decoder 63, four source decoders 64 (only one of them is illustrated), and a D/A converter 65. The variable-length decoder 63 includes four rotators 66 (only one of them is illustrated), four decoding tables 67 (only one of them is illustrated), and four coefficient processing devices 68 (only one of them is illustrated).

Figure 20B:
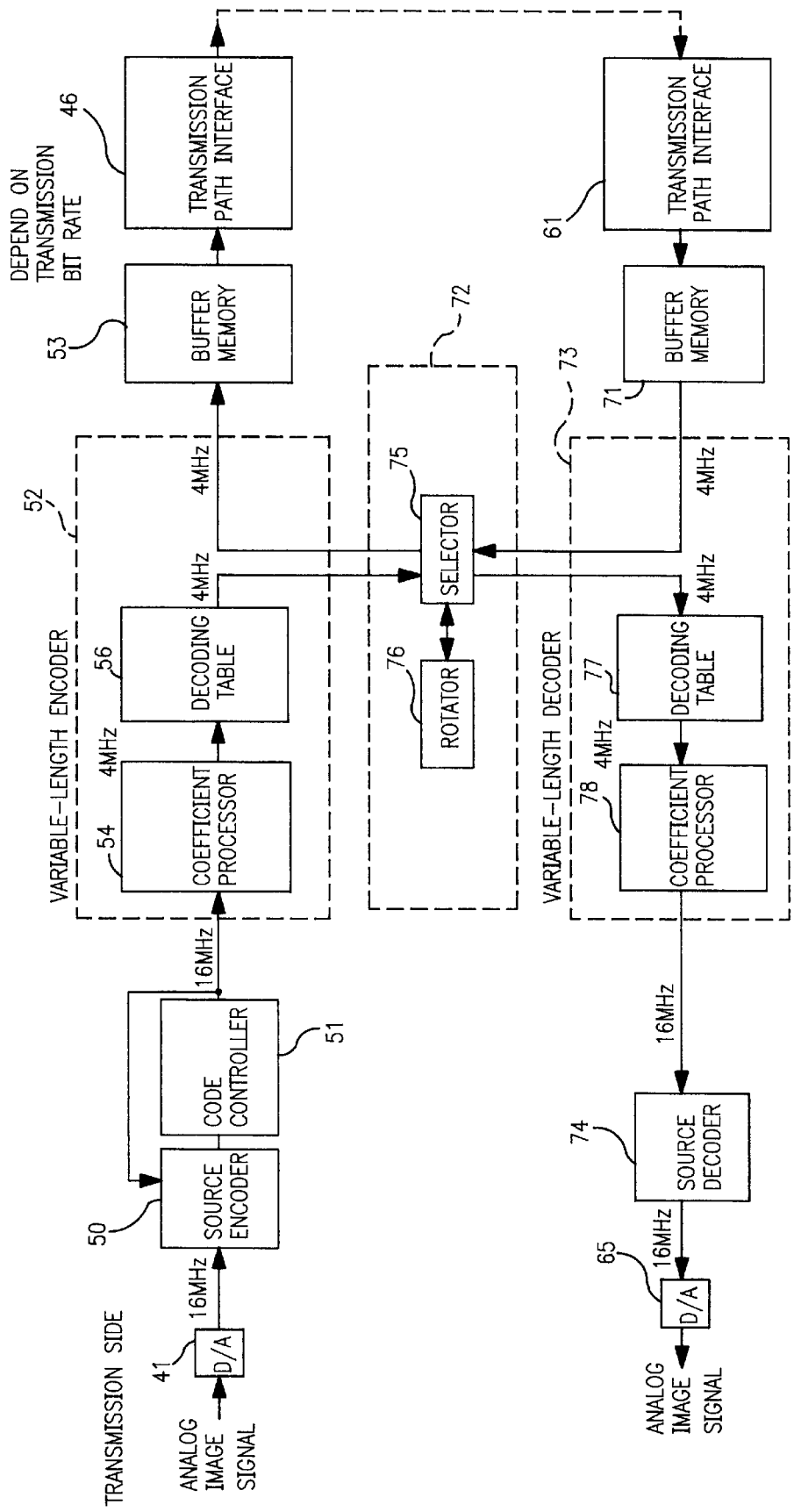
FIG. 20B is a block diagram of a transmission system having the image encoding control system having the parallel structure according to the second embodiment of the present invention shown in FIG. 18B.

FIG. 20B is a block diagram of a transmission/reception system according to the present invention. Although the transmission/reception system includes four systems, as shown in FIG. 19B, only one system is illustrated in FIG. 20B for the sake of simplicity, and reference numerals having no suffixes are used. Further, the selector 55 in the variable-length encoder 52 is omitted. Similarly, one of the four systems on the reception side is illustrated. The reception system has the transmission path interface 61, a single buffer memory 71, a variable-length decoder 73, four source decoders 74 (only one of them is illustrated), and the D/A converter 65. The variable-length decoder 73 has a single decoding table 77 and four coefficient processing devices 78 (only one of them is illustrated).

A variable-length encoder/decoder common block (hereafter simply referred to as a common block) 72 is provided in common for the transmitter and the receiver. The common block 72 has a selector 75 and a rotator 76. The transmitter and receiver use the common block by time division. An output of the encoding table 56 of the transmitter is input to the rotator 76 through the selector 75. An output of the rotator 76 is applied to the buffer memory 53 of the transmitter through the selector 75. An output of the buffer memory 71 of the receiver is applied to the rotator 76 through the selector 75, and output of the rotator 76 is input to the decoding table 77 through the selector 75. In the above-mentioned way, the rotator 76 is used in common for the transmitter and the receiver, so that the scale of the entire transmission/reception system can be reduced.

Figure 21:
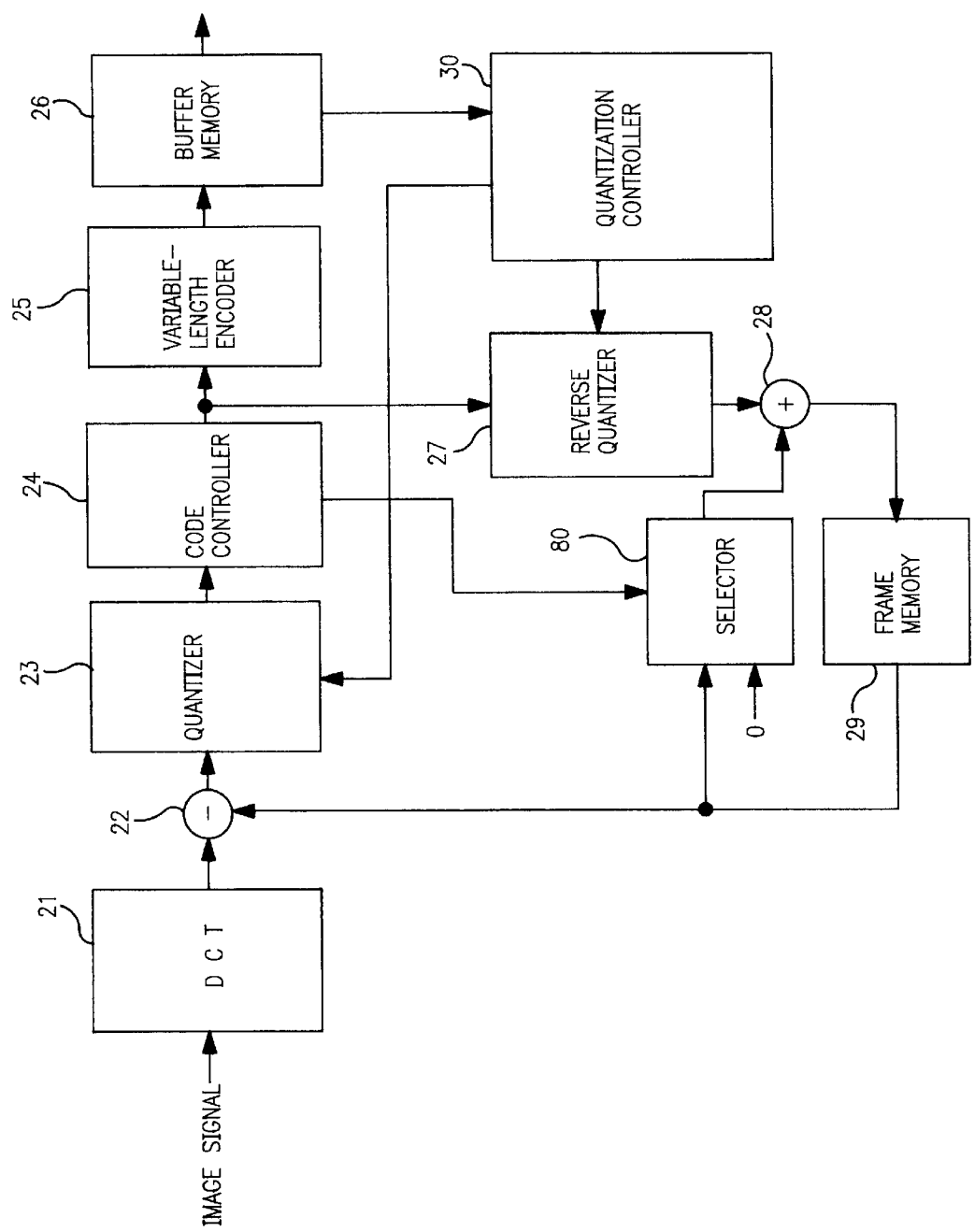
FIG. 21 is a block diagram of an image encoding control system according to a third embodiment of the present invention.

FIG. 21 is a block diagram of an image encoding control system according to a third embodiment of the present invention. In FIG. 21, those parts which are the same as those shown in FIG. 3 are given the same reference numerals. The structure shown in FIG. 21 is formed by adding a selector 80 to the structure shown in FIG. 3. The selector 80 outputs either the output of the frame memory 29 or "0" in accordance with the select signal output by the comparator 103 (FIG. 4) of the code controller 24. While the select signal is not being output, the selector 80 selects the output of the frame memory 29. When the select signal is output, the selector 80 selects "0".

FIG. 22A is a diagram showing the operation of the structure shown in FIG. 3, and FIG. 22B is a diagram showing the operation of the structure shown in FIG. 21. Dot areas of an X block shown in FIG. 22A(a) are inhibited from omitting transform coefficients (effective coefficients and "0") therefrom. That is, all the transform coefficients of the X block pass through the code controller 24 (FIG. 3) without being omitted. In a subsequent X+1 block, only transform coefficients in an area A1 are allowed to pass through the code controller 24, and the remaining transform coefficients are omitted. In a subsequent X+2 block, only transform coefficients in an area A2 are allowed to pass through the code controller 24, and the remaining transform coefficients are omitted.

The contents of the X block are output to the subtracter 22 via the frame memory 29, and the difference between the contents of the X block and X+1 block is calculated. Thus, the transform coefficients of the X block appear in an area of the X+1 block other than the area A1. Similarly, the area A2 of the X+2 block is partially affected by the transform coefficients of the X block, and the transform coefficients of the X block appear in an area of the X+2 block other than the area A2. Thus, the quality of the reproduced image will deteriorate. That is, the threshold values TH1 and TH2 used in the code controller 24 are set to small values, high-frequency components of some previous frames will remain in some subsequent frames. The selector 80 shown in FIG. 21 is provided for overcoming the above-mentioned problem.

As shown in FIG. 22B(b), after the area A1 of the X+1 block is processed, the select signal output by the code controller 24 is applied to the selector 80. Thus, "0" is written into the area of the X+1 block other than the block A1 in place of the real transform coefficients of the X block. Thus, no high-frequency components of the previous block remain in the subsequent block.

Figure 23:
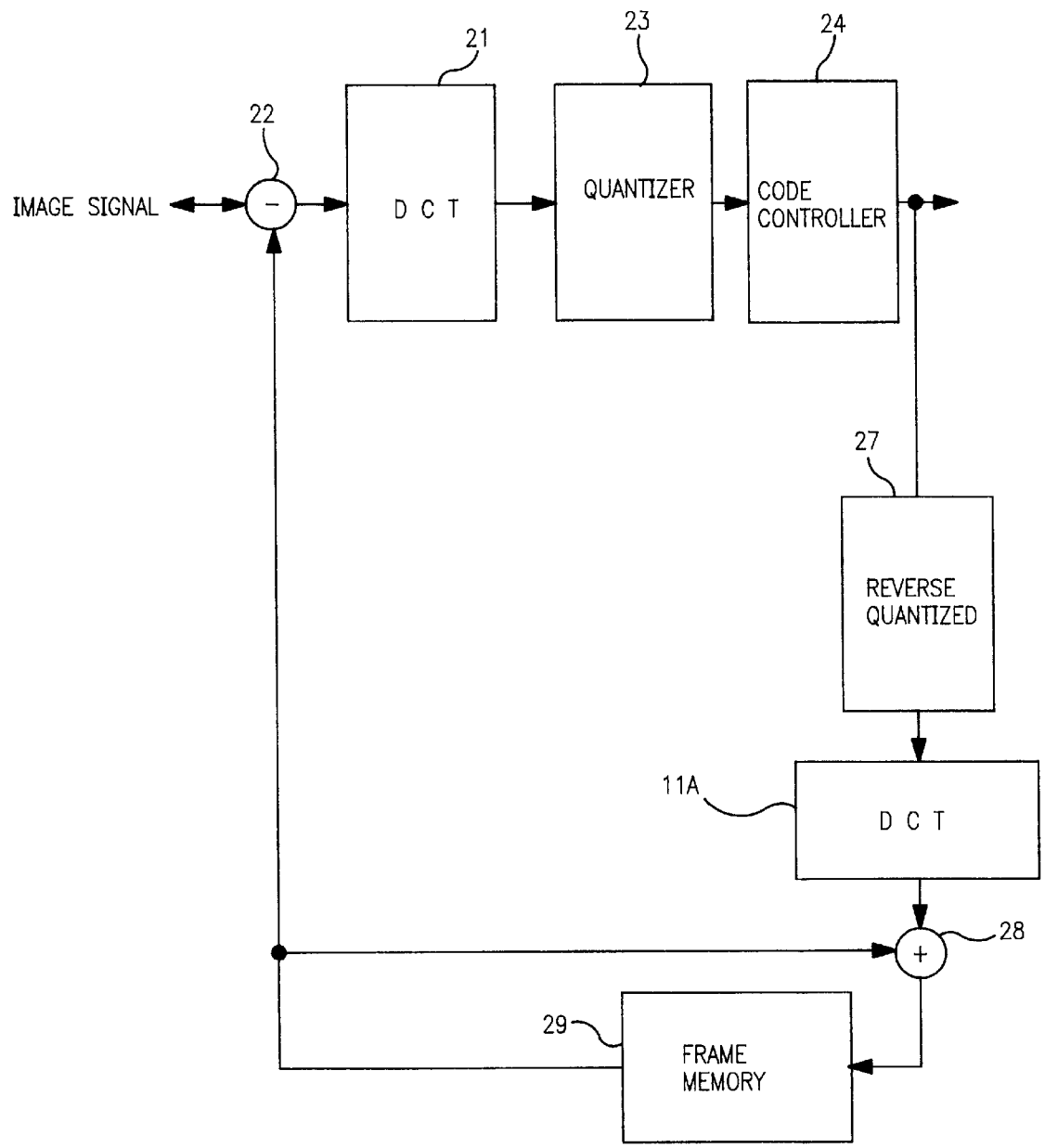
FIG. 23 is a block diagram of an image encoding control system according to a fourth embodiment of the present invention.

FIG. 23 is a block diagram of an image encoding control system according to a fourth embodiment of the present invention. In FIG. 23, those parts which are the same as those shown in the previous figures are given the same reference numerals. The embodiment shown in FIG. 23 has an arrangement based on a predictive encoding having the orthogonal transforming function. The interframe difference between the image signal and the content of the previous frame is calculated and subjected to the orthogonal transform encoding in a processing block unit by the discrete cosine transform device 21. The output of the discrete cosine transform device 21 is quantized by the quantizer 23 and applied to the code controller 24, which sends a limited number of codes to the variable-length encoder not shown.

In the embodiment being considered, a loop having the orthogonal transform is formed, and thus a reverse discrete cosine transform device 11A receives the output signal of the reverse quantizer 27. The discrete cosine transform device 11A carries out a reverse discrete cosine transform encoding to the orthogonal transform codes output by the discrete cosine transform device 21. The output of the reverse cosine transform device 11A is added to the adder 28.

The present invention is not limited to the embodiments described hereinbefore. The orthogonal transform encoder 21 may be formed of an encoder based on any of the orthogonal transform means, such as the Fourier transform and Hadamard transform, and may be combined with any of various predictive encoding means, such as an interframe encoding. Further, the aforementioned threshold values TH1 and TH2 can be selected on the basis of the size of the block and the type of the orthogonal transform means.

INDUSTRIAL APPLICABILITY

The present invention can be applied to a transfer system in which a large amount of image data is transferred, such as an HDTV, a teleconference and a TV telephone.

We claim:

1. An image encoding control system for encoding an input image signal representing an image defined by a plurality of pixels, said image encoding control system comprising:

orthogonal transform encoding means for dividing said input image signal into a plurality of blocks and for performing orthogonal transform encoding of each block and thereby producing, as outputs, transform coefficients for each block related to the plurality of pixels;

code control means for receiving said transform coefficients for each block, as output by said orthogonal transform encoding means, identifying a limited number of said transform coefficients which are indicative of a number of variable-length code words for each block not larger than a predetermined number and outputting said limited number of said transform coefficients;

variable-length encoding means for receiving said limited number of said transform coefficients, as output by said code control means, converting said limited number of said transform coefficients for each block into said variable-length code words, and outputting the number of said variable length code words not larger than said predetermined number; and buffer memory means for temporarily storing said variable-length code words output by said variable-length encoding means for each block, wherein:

each of said variable-length code words is a two-dimensional variable-length code; and said code control means comprises:

first count means for identifying effective coefficients of said transform coefficients, each effective coefficient being a non-zero transform coefficient, and for counting a number of said effective coefficients for each block;

comparing means for comparing the number of said effective coefficients counted by said first count means with a predetermined threshold value; and select means, provided between said orthogonal transform encoding means and said variable-length encoding means, for enabling transmission of said transform coefficients output by said orthogonal transform encoding means when the number of said effective coefficients is not larger than said predetermined threshold value based upon the comparison by said comparing means and not enabling transmission of said transform coefficients when the number of effective coefficients exceeds said predetermined threshold value based upon the comparison by said comparing means.

2. The image encoding control system as claimed in claim 1, wherein said predetermined threshold value is equal to said predetermined number.

3. The image encoding control system as claimed in claim 1, wherein said variable length encoding means comprises:

second count means for identifying strings of consecutive zeros of said limited number of said transform coefficients output by said code control means and for counting numbers of consecutive zeros in corresponding said strings of consecutive zeros of said limited number of said transform coefficients output by said code control means; and converting means for generating said variable-length code words from said numbers of consecutive zeros output by said second count means and said effective coefficients output by said code control means.

4. The image encoding control means as claimed in claim 3, wherein said converting means comprises:

memory means having addresses, each address storing a respective code word and code length, for outputting said stored code words and code lengths from respective addresses indicated by corresponding said numbers of consecutive zeros output by said second count means and corresponding said effective coefficients output by said code control means; and rotating means for generating said variable-length code words based upon said stored code words and code lengths output from said memory means.

5. The image encoding control system as claimed in claim 1, wherein each of said blocks has n×n pixels.

6. An image encoding control system for encoding an input image signal representing an image defined by a plurality of pixels, said image encoding control system comprising:

orthogonal transform encoding means for dividing said input image signal into a plurality of blocks and for performing orthogonal transform encoding of each block and thereby producing, as outputs, transform coefficients for each block related to the plurality of pixels;

code control means for receiving said transform coefficients for each block, as output by said orthogonal transform encoding means, identifying a limited number of said transform coefficients which are indicative of a number of variable-length code words for each block not larger than a predetermined number and outputting said limited number of said transform coefficients;

variable-length encoding means for receiving said limited number of said transform coefficients, as output by said code control means, converting said limited number of said transform coefficients for each block into said variable-length code words, and outputting the number of said variable length code words not larger than said predetermined number; and buffer memory means for temporarily storing said variable-length code words output by said variable-length encoding means for each block, wherein:

each of said variable-length code words is a run-length code; and said code control means comprises:

first count means for identifying effective coefficients of said transform coefficients and strings of consecutive zero transform coefficients, each effective coefficient being a non-zero transform coefficient, and for counting, for each block, a number of said effective coefficients and strings of consecutive zero transform coefficients;

comparing means for comparing the number counted by said first count means with a predetermined threshold value; and select means, provided between said orthogonal transform encoding means and said variable-length encoding means, for enabling transmission of said transform coefficients output by said orthogonal transform encoding means when the number counted by said first count means is not larger than said predetermined threshold value based upon the comparison by said comparing means and not enabling transmission of said transform coefficients when the number of said effective coefficients exceeds said predetermined threshold value based upon the comparison by said comparing means.

7. The image encoding control system as claimed in claim 6, wherein said predetermined threshold value is equal to said predetermined number.

8. The image encoding control system as claimed in claim 6, wherein said variable-length encoding means comprises:

second count means for identifying said strings of consecutive zero transform coefficients of said limited number of said transform coefficients output by said code control means and for counting numbers of consecutive said zero transform coefficients in corresponding said strings of consecutive zero transform coefficients output by said code control means;

select means for selecting, for each pixel, one of the number of consecutive zero transform coefficients counted by said second count means and the effective coefficient output by said code control means; and converting means for generating said variable-length code words from one of the numbers of consecutive zero transform coefficients and the effective coefficients selected by said select means for each pixel.

9. The image encoding control system as claimed in claim 8, wherein said converting means comprises:

memory means having a table storing a first stored code word and a first stored code length corresponding to each number of consecutive zero transform coefficients and storing a second stored code word and a second stored code length corresponding to each effective coefficient, and outputting said first and second stored code words and said first and second stored code lengths corresponding to the numbers of consecutive zero transform coefficients and effective coefficients of said limited number of said transform coefficients output by said code control means; and rotating means for generating said variable-length code words based upon said first and second stored code words and said first and second stored code lengths output by said memory means.

10. The image encoding control system as claimed in claim 1, further comprising:

subtracting means for obtaining a difference between a first block of the input image signal being processed and a current addition result and, in response, generating a residual signal supplied to said orthogonal transform encoding means;

said orthogonal transform encoding means orthogonally transforming said residual signal and, in response, generating an orthogonal-transform encoded residual signal;

quantizing means for quantizing said orthogonal-transform encoded residual signal output by said orthogonal transform encoding means and for generating a quantization output corresponding to said transform coefficients;

reverse-quantizing means for reverse-quantizing, for each block, said transform coefficients output by said orthogonal transform encoding means and, in response, generating a reverse-quantization output;

reverse-orthogonal transform encoding means for reverse-orthogonally transforming said reverse-quantization output and, in response generating a reverse-orthogonally transformed code;

adding means for adding said reverse-orthogonally transformed code related to the first block being processed and said reverse-orthogonally transformed code related to a second block which precedes the first block being processed by one block and a preceding addition result of said adding means, and, in response, generating said current addition result; and frame memory means for storing said current addition result from said adding means.

11. An image encoding control system for encoding an input image signal representing a picture, said image encoding control system comprising:

orthogonal transform encoding means for dividing the picture formed by the input image signal into a plurality of blocks each having a plurality of pixels, and for carrying out an orthogonal transform encoding for each block, to produce for each block transform coefficients related to the plurality of pixels;

code control means for processing said transform coefficients of each block which have been scanned from low frequency to high frequency, identifying ones of said transform coefficients which are not zero as effective coefficients, and transmitting, for subsequent variable-length encoding, said transform coefficients in the scanned order until a predetermined number of the effective coefficients has been transmitted;

variable-length encoding means for converting said transform coefficients obtained for each block and transmitted by said code control means into variable-length code words; and buffer means for temporarily storing said predetermined number of variable-length code words output by said variable-length encoding means for each block.

12. The image encoding control system as claimed in claim 11, wherein said predetermined number of variable-length code words is smaller than a number of said transform coefficients related to the plurality of pixels in each block.

13. The image encoding control system as claimed in claim 11, wherein said predetermined number of variable-length code words are two-dimensional variable-length codes, wherein said code control means comprises:

first count means for counting a number of the effective coefficients out of said transform coefficients for each block;

comparing means for comparing the number of effective coefficients counted by said count means with a predetermined threshold value; and select means, provided between said orthogonal transform encoding means and said variable-length encoding means, for selecting said transform coefficients output by said orthogonal transform encoding means when the number of effective coefficients is not greater than said predetermined threshold value and for selecting "0" when the number of effective coefficients exceeds said predetermined threshold value.

14. The image encoding control system as claimed in claim 13, wherein said predetermined threshold value is equal to said predetermined number of variable-length code words.

15. The image encoding control system as claimed in claim 13, wherein said variable-length encoding means comprises:

second count means for counting, for each block, a number of consecutive zeros out of said transform coefficients output by said code control means; and converting means for generating said predetermined number of variable-length code words from said number of consecutive zeros and said effective coefficients output by said code control means.

16. The image encoding control system as claimed in claim 15, wherein said converting means comprises:

memory means for having, as addresses, the numbers of consecutive zeros of said transform coefficient and said corresponding effective coefficients and for storing code words and code lengths related to said numbers of consecutive zeros and said corresponding effective coefficients; and rotating means for generating said variable-length code words from said code words and corresponding code lengths output from said memory means.

17. An image encoding control system as claimed in claim 16, wherein said rotating means is used in common with an image decoding system.

18. The image encoding control means as claimed in claim 11, wherein:

said code control means comprises:

first count means for counting, for each block, a sum total of a number of the effective coefficients out of said transform coefficients;

comparing means for comparing the sum total counted by said count means with a predetermined threshold value; and select means, provided between said orthogonal transform encoding means and said variable-length encoding means, for selecting said transform coefficients output by said orthogonal transform encoding means when the number of effective coefficients is not greater than said predetermined threshold value and for selecting "0" when the number of effective coefficients exceeds said predetermined threshold value; and said variable-length encoding means counts, for each block, a number of said transform coefficients having consecutive zeros for each string of transform coefficients having consecutive zeros, and said variable-length encoding means converts said selected transform coefficients output by said select means into variable-length code words which are run-length codes.

19. The image encoding control system as claimed in claim 18, wherein said predetermined threshold value is equal to said predetermined number of variable-length code words.

20. The image encoding control system as claimed in claim 18, wherein said variable-length encoding means comprises:

second count means for counting, for each block, a number of consecutive zeros out of said transform coefficients output by said code control means;

select means for selecting the number of consecutive zeros counted by said count means and said effective coefficients output by said code control means; and converting means for generating said variable-length code words from the number of consecutive zeros and said effective coefficients selected by said select means.

21. The image encoding control system as claimed in claim 20, wherein said converting means comprises:

memory means for having a first table storing a code word and a code length corresponding to each said number of consecutive zeros and for having a code word and a code length corresponding to each said effective coefficient; and rotating means for generating said variable-length code words from said code words and said code lengths output by said memory means.

22. An image encoding control system as claimed in claim 21, wherein said rotating means is used in common with an image decoding system.

23. The image encoding control system as claimed in claim 11, wherein:

each of said transform coefficients is a residual signal between input image signals related to blocks of two consecutive frames; and said image encoding control system comprises quantizing means for quantizing said residual signal and for outputting a quantization output corresponding to a corresponding one of said transform coefficients.

24. The image encoding control system as claimed in claim 23, further comprising:

reverse quantizing means for reverse-quantizing, for each block, said transform coefficients supplied from said code control means and for generating a reverse-quantization output;

frame memory means for storing the reverse-quantization output related to a sum of a block which precedes a block being processed by said quantization means by one block and previously stored reverse-quantization outputs;

adding means for adding the reverse-quantization output related to the block being processed and the reverse-quantization output related to the sum of the block preceding said block being processed by one block and the previously stored reverse-quantization outputs; and subtracting means for obtaining a difference between the input image signal related to the block being processed and the reverse-quantization output related to the sum of the block preceding the block being processed by one block and the previously stored reverse quantization outputs, and for generating said residual signal.

25. The image encoding control as claimed in claim 24, wherein:

said predetermined number of variable-length code words are two-dimensional variable-length codes; and said code control means comprises:

count means for counting, for each block, a number of the effective coefficients out of said transform coefficients;

comparing means for comparing the number of effective coefficients with a predetermined threshold value; and a selector for selecting said transform coefficients output by said orthogonal transform encoding means when said number of effective coefficients is not greater than said predetermined threshold value and for selecting "0" when said number of effective coefficients exceeds said predetermined threshold value, and wherein said select means selects "0" when said selector selects "0", and selects the reverse-quantization output from said frame memory means when said selector selects said transform coefficients from said orthogonal transform encoding means.

26. The image encoding control system as claimed in claim 24, wherein each of said blocks has n×n pixels (n being an arbitrary integer).

27. The image encoding control system as claimed in claim 11, further comprising:

subtracting means for obtaining a difference between the input image signal being processed and the input image signal related to a block which precedes the block being processed by one block and for generating a residual signal supplied to said orthogonal transform encoding means;

quantizing means for quantizing an orthogonal-transform-encoded residual signal output by said orthogonal transform encoding means and for generating a quantization output corresponding to said transform coefficients;

reverse-quantizing means for reverse-quantizing, for each block, said transform coefficients output by said orthogonal transform encoding means and for generating a reverse-quantization output;

reverse-orthogonal transform encoding means for reverse-orthogonally transforming said reverse-quantization output;

adding means for adding a reverse-orthogonally transformed code output related to the block being processed and a reverse-orthogonally transformed code output related to a sum of the block which precedes the block being considered by one block and previously stored reverse-quantization outputs, to produce an addition result; and frame memory means for storing the addition result from said adding means, said addition result read out from said frame memory means being a frame memory output supplied to said subtracting means.

28. An image encoding control system for encoding an input image signal representing a picture, said image encoding control system comprising:

orthogonal transform encoding means for dividing the picture formed by the input image signal into a plurality of blocks each having a plurality of pixels, and for carrying out an orthogonal transform encoding for each block, to produce for each block transform coefficients related to the plurality of pixels;

code control means for processing said transform coefficients of each block which have been scanned from low frequency to high frequency, identifying only ones of said transform coefficients which are not zero as effective coefficients, and transmitting, for subsequent variable-length encoding, said transform coefficients in the scanned order until a predetermined number of the effective coefficients has been transmitted;

variable-length encoding means for converting said transform coefficients obtained for each block and transmitted by said code control means into variable-length code words; and buffer means for temporarily storing said predetermined number of variable-length code words output by said variable-length encoding means for each block.

* * * * *

UNITED STATES PATENT AND TRADEMARK OFFICE
CERTIFICATE OF CORRECTION

PATENT NO. : 5,844,611
DATED : December 1, 1998
INVENTOR(S) : Takashi HAMANO et al.

It is certified that error appears in the above-identified patent and that said Letters Patent is hereby corrected as shown below:

On the title page, [30] Foreign Application Priority Data, insert --PCT/JP90/01057 08/21/90--.

On the title page, [56] References Cited, Foreign Patent Documents, insert --63-13250 06/04/88 Japan--.

Col. 1,     line 34, after "of" insert --from--;
           line 35, after "and" insert --from--;
           line 55, change "compromises" to --comprises--.

Col. 2,     line 17, after "implemented" insert --in a smaller size than a conventional circuit--.

Col. 7,     line 65, after "input" insert --,--.

Col. 10,     line 32, after "signal" insert --,--.

Signed and Sealed this

Twenty-fourth Day of August, 1999

Attest:

Q. TODD DICKINSON

*Attesting Officer*          *Acting Commissioner of Patents and Trademarks*